US012237259B2

(12) United States Patent
Fukuzumi et al.

(10) Patent No.: US 12,237,259 B2
(45) Date of Patent: Feb. 25, 2025

(54) ELECTRONIC DEVICES COMPRISING MULTILEVEL BITLINES, AND RELATED METHODS AND SYSTEMS

(71) Applicant: Micron Technology, Inc., Boise, ID (US)

(72) Inventors: Yoshiaki Fukuzumi, Kanagawa (JP); Harsh Narendrakumar Jain, Boise, ID (US); Naveen Kaushik, Boise, ID (US); Adam L. Olson, Boise, ID (US); Richard J. Hill, Boise, ID (US); Lars P. Heineck, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 607 days.

(21) Appl. No.: 17/443,531

(22) Filed: Jul. 27, 2021

(65) Prior Publication Data

US 2023/0033803 A1 Feb. 2, 2023

(51) Int. Cl.
*H01L 23/522* (2006.01)
*H01L 21/768* (2006.01)
(Continued)

(52) U.S. Cl.
CPC .... *H01L 23/5226* (2013.01); *H01L 21/76802* (2013.01); *H01L 21/7682* (2013.01);
(Continued)

(58) Field of Classification Search
CPC ........... H01L 23/5226; H01L 21/76802; H01L 21/7682; H01L 21/76843; H01L 21/76877;
(Continued)

(56) References Cited

U.S. PATENT DOCUMENTS 5,597,748 A 1/1997 Asano et al.
9,281,317 B2 3/2016 Higashitani et al.
(Continued)

FOREIGN PATENT DOCUMENTS

CN 108735711 A 11/2018
TW 202118012 A 5/2021

OTHER PUBLICATIONS

U.S. Appl. No. 16/877,233, filed May 18, 2020, titled "Microelectronic Devices Including Contact Structures, and Related Electronic Systems and Methods", to Hu et al., 54 pages.
(Continued)

*Primary Examiner* — Patricia D Valenzuela
(74) *Attorney, Agent, or Firm* — TraskBritt

(57) ABSTRACT

An electronic device comprising multilevel bitlines comprising first bitlines and second bitlines. The first bitlines and the second bitlines are positioned at different levels. Pillar contacts are electrically connected to the first bitlines and to the second bitlines. Level 1 contacts are electrically connected to the first bitlines and level 2 contacts are electrically connected to the second bitlines. A liner is between the first bitlines and the level 2 contacts. Each bitline of the first bitlines is electrically connected to a single pillar contact in a subblock adjacent to the level 1 contacts and each bitline of the second bitlines is electrically connected to a single pillar contact adjacent to the level 2 contacts. Methods of forming an electronic device and related systems are also disclosed.

28 Claims, 19 Drawing Sheets

(51) Int. Cl.
  *H01L 23/528* (2006.01)
  *H01L 23/532* (2006.01)
  *H10B 41/35* (2023.01)
  *H10B 43/35* (2023.01)
(52) U.S. Cl.
  CPC .. *H01L 21/76843* (2013.01); *H01L 21/76877* (2013.01); *H01L 23/528* (2013.01); *H01L 23/5329* (2013.01); *H10B 41/35* (2023.02); *H10B 43/35* (2023.02)
(58) Field of Classification Search
  CPC ............... H01L 23/528; H01L 23/5329; H01L 21/76831; H01L 21/76808; H01L 21/76897; H01L 21/7681; H10B 12/482; H10B 41/35; H10B 43/35
  See application file for complete search history.

(56) References Cited

U.S. PATENT DOCUMENTS

| | | |
|---|---|---|
| 2015/0333001 A1 | 11/2015 | Sakui et al. |
| 2016/0099254 A1 | 4/2016 | Park et al. |
| 2016/0155659 A1* | 6/2016 | Yang .................. H01L 21/7682 438/269 |
| 2017/0040336 A1 | 2/2017 | Lee et al. |
| 2017/0125433 A1 | 5/2017 | Ogawa et al. |
| 2020/0091164 A1 | 3/2020 | Liu |
| 2020/0381448 A1 | 12/2020 | Lee et al. |
| 2021/0193570 A1* | 6/2021 | Moschiano ............ H10B 43/35 |
| 2021/0313334 A1 | 10/2021 | Kobayashi et al. |
| 2022/0093629 A1 | 3/2022 | Kim et al. |
| 2022/0336367 A1* | 10/2022 | Tsai .................. H01L 21/76846 |

OTHER PUBLICATIONS

U.S. Appl. No. 16/877,209, filed May 18, 2020, titled "Methods for Forming Electronic Apparatus with Tiered Stacks Having Conductive Isolated By Trenches, and Related Electronic Apparatus and Systems", to Hu, 65 pages.

U.S. Appl. No. 17/007,951, filed Aug. 31, 2020, titled "Microelectronic Devices Including Isolation Structures Protruding Into Upper Pillar Portions, and Related Methods and Systems", to King et al., 77 pages.

* cited by examiner

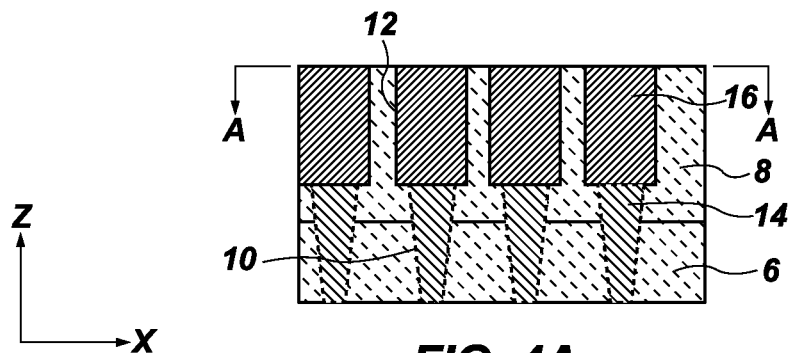
FIG. 4A
FIG. 4B
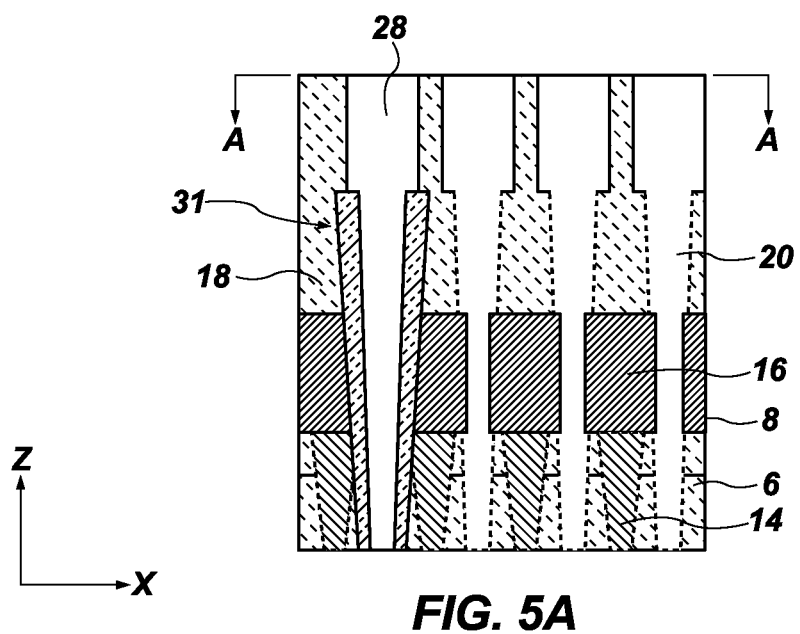
FIG. 5A

ELECTRONIC DEVICES COMPRISING MULTILEVEL BITLINES, AND RELATED METHODS AND SYSTEMS

CROSS-REFERENCE TO RELATED APPLICATION

This application is related to U.S. patent application Ser. No. 17/443,521, entitled "ELECTRONIC DEVICES COMPRISING MULTILEVEL BITLINES AND RELATED METHODS AND SYSTEMS," filed on even date herewith and assigned to the Assignee of the present application, the entire disclosure of which is hereby incorporated herein in its entirety by this reference.

TECHNICAL FIELD

Embodiments disclosed herein relate to electronic devices and electronic device fabrication. More particularly, embodiments of the disclosure relate to electronic devices comprising multilevel bitlines and to related methods and systems.

BACKGROUND

Electronic device (e.g., semiconductor device, memory device) designers often desire to increase the level of integration or density of features (e.g., components) within an electronic device by reducing the dimensions of the individual features and by reducing the separation distance between neighboring features. Electronic device designers also desire to design architectures that are not only compact, but offer performance advantages, as well as simplified designs. Reducing the dimensions and spacing of features has placed increasing demands on the methods used to form the electronic devices. One solution has been to form three-dimensional (3D) electronic devices, such as 3D NAND devices, in which memory cells are positioned vertically on a substrate. However, as the memory cells are formed at smaller dimensions and closer together, capacitance between adjacent bitlines increases. The increased bitline-bitline capacitance increases a time to program and read of the electronic device. An increase in bitline-bitline capacitance is also observed when a pitch of the bitlines is decreased. Therefore, continuing to decrease the pitch of the bitlines is not possible as the dimensions and spacing of memory cells becoming smaller.

BRIEF DESCRIPTION OF THE DRAWINGS

FIGS. 4A-8B are cross-sectional and top down views illustrating the formation of the electronic devices of FIGS. 1A-3B according to embodiments of the disclosure;

DETAILED DESCRIPTION

Figure 1A:
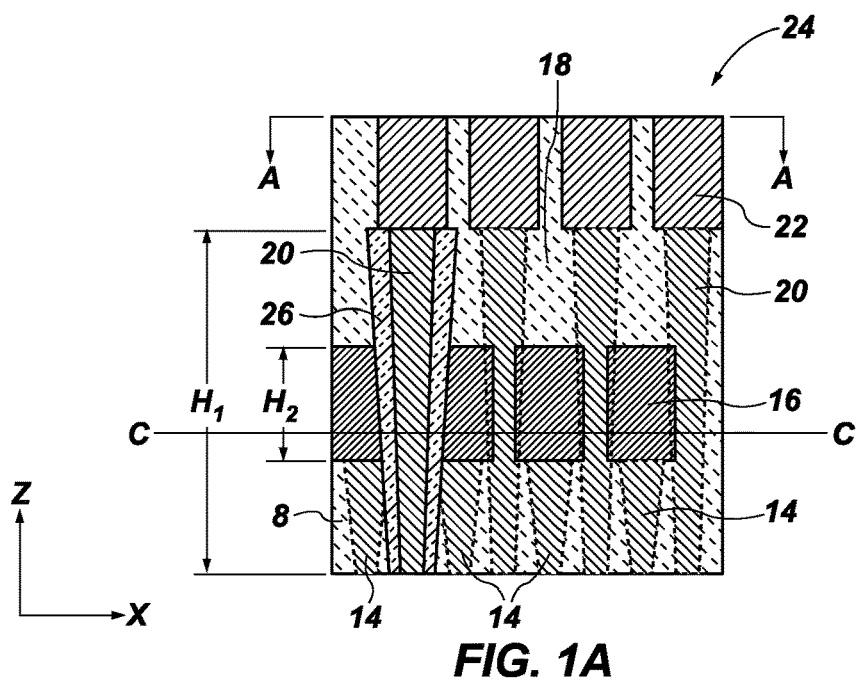
FIGS. 1A, 2A, and 3A are cross-sectional views of electronic devices including multilevel bitlines according to embodiments of the disclosure.

An electronic device (e.g., an apparatus, a semiconductor device, a memory device) that includes one or more multilevel bitlines is disclosed. The bitlines (e.g., data lines, digit lines) of the electronic device are located at multiple levels (elevations, heights) of the electronic device, with one set of bitlines extending continuously in a first level (L1) of the electronic device and another set of bitlines extending continuously in a second level (L2) of the electronic device. The set of bitlines in the first level is referred to herein as L1 bitlines or first bitlines, and the set of bitlines in the second level is referred to herein as L2 bitlines or second bitlines. The L1 bitlines are proximal to a base material and the L2 bitlines are distal to the base material. The L1 bitlines and the L2 bitlines are not in physical contact with one another or in electrical contact with one another.

Adjacent L1 bitlines are separated from (e.g., isolated from) one another by a dielectric material (e.g., a liner). The liner may extend between the adjacent L1 bitlines for at least a portion of a height of the L1 bitlines. The liner may extend between the adjacent L1 bitlines substantially the entire height of the L1 bitlines or may extend a greater height than the height of the L1 bitlines or a lesser height than the height of the L1 bitlines. Therefore, the liner may be substantially coextensive with the L1 bitlines along its entire height or may extend partially above or partially below the height of the L1 bitlines. At least a portion of the liner may, therefore, be present between the adjacent L1 bitlines. By adjusting dimensions (e.g., a height) of the liner, capacitance of the electronic device containing the liner may be tailored. A portion of L2 contacts, which electrically couple the L2 bitlines to other conductive components of the electronic device, may also separate the adjacent L1 bitlines from one another. Adjacent L2 bitlines are separated from (e.g., isolated from) one another by a dielectric material or by an air gap. The liner may be adjacent to at least a portion of the L2 contacts, such as laterally adjacent to the L2 contacts along an entire height thereof or along only a portion thereof.

The multilevel bitlines (e.g., a combination of the L1 bitlines and the L2 bitlines) are operably coupled to (e.g., electrically connected to) underlying contacts (e.g., pillar contacts), with each bitline of the multilevel bitlines electrically connected to a single (e.g., one) pillar contact in a subblock. The multilevel bitlines and the pillar contacts are electrically connected to one another through L1 contacts and L2 contacts, with the L1 contacts and the L2 contacts exhibiting a different dimension (e.g., a length) from one another through materials of the electronic device. Each of the multilevel bitlines is electrically connected to a single (e.g., one) L1 contact or a single (e.g., one) L2 contact, which, in turn, is electrically connected to a single (e.g., one) pillar contact in the subblock. The bitlines of the multilevel bitlines are also substantially equally spaced from one another. The electronic device containing the multilevel bitlines according to embodiments of the disclosure exhibits improved bitline-bitline capacitance in comparison to a conventional electronic device in which bitlines are located in only a single (e.g., one) level.

The following description provides specific details, such as material types, material thicknesses, and process conditions in order to provide a thorough description of embodiments described herein. However, a person of ordinary skill in the art will understand that the embodiments disclosed herein may be practiced without employing these specific details. Indeed, the embodiments may be practiced in conjunction with conventional fabrication techniques employed in the semiconductor industry. In addition, the description provided herein does not form a complete description of an electronic device or a complete process flow for manufacturing the electronic device and the structures described below do not form a complete electronic device. Only those process acts and structures necessary to understand the embodiments described herein are described in detail below. Additional acts to form a complete electronic device may be performed by conventional techniques.

Unless otherwise indicated, the materials described herein may be formed by conventional techniques including, but not limited to, spin coating, blanket coating, chemical vapor deposition (CVD), atomic layer deposition (ALD), plasma enhanced ALD, physical vapor deposition (PVD) (including sputtering, evaporation, ionized PVD, and/or plasma-enhanced CVD), or epitaxial growth. Alternatively, the materials may be grown in situ. Depending on the specific material to be formed, the technique for depositing or growing the material may be selected by a person of ordinary skill in the art. The removal of materials may be accomplished by any suitable technique including, but not limited to, etching (e.g., dry etching, wet etching, vapor etching), ion milling, abrasive planarization (e.g., chemical-mechanical planarization), or other known methods unless the context indicates otherwise.

Drawings presented herein are for illustrative purposes only, and are not meant to be actual views of any particular material, component, structure, electronic device, or electronic system. Variations from the shapes depicted in the drawings as a result, for example, of manufacturing techniques and/or tolerances, are to be expected. Thus, embodiments described herein are not to be construed as being limited to the particular shapes or regions as illustrated, but include deviations in shapes that result, for example, from manufacturing. For example, a region illustrated or described as box-shaped may have rough and/or nonlinear features, and a region illustrated or described as round may include some rough and/or linear features. Moreover, sharp angles that are illustrated may be rounded, and vice versa. Thus, the regions illustrated in the figures are schematic in nature, and their shapes are not intended to illustrate the precise shape of a region and do not limit the scope of the present claims. The drawings are not necessarily to scale. Additionally, elements common between figures may retain the same numerical designation.

As used herein, the singular forms "a," "an," and "the" are intended to include the plural forms as well, unless the context clearly indicates otherwise.

As used herein, the term "air gap" means and includes an opening that is empty of a solid material and/or liquid material. However, the air gap may contain a gaseous material (e.g., air, oxygen, nitrogen, argon, helium, or a combination thereof).

As used herein, "and/or" includes any and all combinations of one or more of the associated listed items.

As used herein, "about" or "approximately" in reference to a numerical value for a particular parameter is inclusive of the numerical value and a degree of variance from the numerical value that one of ordinary skill in the art would understand is within acceptable tolerances for the particular parameter. For example, "about" or "approximately" in reference to a numerical value may include additional numerical values within a range of from 90.0 percent to 110.0 percent of the numerical value, such as within a range of from 95.0 percent to 105.0 percent of the numerical value, within a range of from 97.5 percent to 102.5 percent of the numerical value, within a range of from 99.0 percent to 101.0 percent of the numerical value, within a range of from 99.5 percent to 100.5 percent of the numerical value, or within a range of from 99.9 percent to 100.1 percent of the numerical value.

As used herein, spatially relative terms, such as "beneath," "below," "lower," "bottom," "above," "upper," "top," "front," "rear," "left," "right," and the like, may be used for ease of description to describe one element's or feature's relationship to another element(s) or feature(s) as illustrated in the figures. Unless otherwise specified, the spatially relative terms are intended to encompass different orientations of the materials in addition to the orientation depicted in the figures. For example, if materials in the figures are inverted, elements described as "below" or "beneath" or "under" or "on bottom of" other elements or features would then be oriented "above" or "on top of" the other elements or features. Thus, the term "below" can encompass both an orientation of above and below, depending on the context in which the term is used, which will be evident to one of ordinary skill in the art. The materials may be otherwise oriented (e.g., rotated 90 degrees, inverted, flipped) and the spatially relative descriptors used herein interpreted accordingly.

As used herein, the term "conductive material" means and includes an electrically conductive material. The conductive material may include, but is not limited to, one or more of a doped polysilicon, undoped polysilicon, a metal, an alloy, a conductive metal oxide, a conductive metal nitride, a conductive metal silicide, and a conductively doped semiconductor material. By way of example only, the conductive material may be one or more of tungsten (W), tungsten nitride ($WN_y$), nickel (Ni), tantalum (Ta), tantalum nitride ($TaN_y$), tantalum silicide ($TaSi_x$), platinum (Pt), copper (Cu), silver (Ag), gold (Au), aluminum (Al), molybdenum (Mo), titanium (Ti), titanium nitride ($TiN_y$), titanium silicide ($TiSi_x$), titanium silicon nitride ($TiSi_xN_y$), titanium aluminum nitride ($TiAl_xN_y$), molybdenum nitride ($MoN_x$), iridium (Ir), iridium oxide ($IrO_z$), ruthenium (Ru), ruthenium oxide ($RuO_z$), n-doped polysilicon, p-doped polysilicon, undoped polysilicon, and conductively doped silicon.

As used herein, the term "configured" refers to a size, shape, material composition, and arrangement of one or more of at least one structure and at least one apparatus facilitating operation of one or more of the structure and the apparatus in a pre-determined way.

As used herein, the phrase "coupled to" refers to structures operably connected with each other, such as electrically connected through a direct ohmic connection or through an indirect connection (e.g., via another structure).

As used herein, the term "dielectric material" means and includes an electrically insulative material. The dielectric material may include, but is not limited to, one or more of an insulative oxide material or an insulative nitride material.

A dielectric oxide may be an oxide material, a metal oxide material, or a combination thereof. The dielectric oxide may include, but is not limited to, a silicon oxide ($SiO_x$, silicon dioxide ($SiO_2$)), doped $SiO_x$, phosphosilicate glass, borosilicate glass, borophosphosilicate glass, fluorosilicate glass, tetraethylorthosilicate (TEOS), aluminum oxide ($AlO_x$), gadolinium oxide ($GdO_x$), hafnium oxide ($HfO_x$), magnesium oxide ($MgO_x$), niobium oxide ($NbO_x$), tantalum oxide ($TaO_x$), titanium oxide ($TiO_x$), zirconium oxide ($ZrO_x$), hafnium silicate, a dielectric oxynitride material (e.g., $SiO_xN_y$), a dielectric carboxynitride material (e.g., $SiO_xC_zN_y$), a combination thereof, or a combination of one or more of the listed materials with silicon oxide. A dielectric nitride material may include, but is not limited to, silicon nitride.

As used herein, the term "electronic device" includes, without limitation, a memory device, as well as semiconductor devices which may or may not incorporate memory, such as a logic device, a processor device, or a radiofrequency (RF) device. Further, an electronic device may incorporate memory in addition to other functions such as, for example, a so-called "system on a chip" (SoC) including a processor and memory, or an electronic device including logic and memory. The electronic device may, for example, be a 3D electronic device, such as a 3D NAND Flash memory device.

As used herein, the term "etch stop" material means and includes a material that is resistant to removal (e.g., etch) relative to removal of one or more other exposed materials.

As used herein, the term "level" refers to a particular elevation (in a z direction) of a particular feature. Features that are present at different levels of the electronic device do not physically contact each other.

As used herein, the term "low-k dielectric material" means and includes a dielectric material, such as a dielectric oxide material, having a dielectric constant lower than the dielectric constant of a silicon oxide ($SiO_x$, $SiO_2$) material or of a carbon-doped silicon oxide material that includes silicon atoms, carbon atoms, oxygen atoms, and hydrogen atoms. The dielectric constant of silicon dioxide is from about 3.7 to about 3.9. The term "low-k dielectric material" is a relative term and is distinguished from the term "dielectric material" by a relative value of its dielectric constant.

As used herein, the term "multilevel bitlines" refers to multiple bitlines (e.g., sets of bitlines) present at different locations (e.g., levels, elevations) in the electronic device. The bitlines include and are formed of a conductive material, with each set of the multilevel bitlines operably connected (e.g., electrically connected) to the pillar contacts and to access lines (e.g., wordlines) of the electronic device. The multilevel bitlines are electrically connected to the pillar contacts by contacts (e.g., L1 contacts, L2 contacts) adjacent to the different levels.

As used herein, reference to an element as being "on" or "over" another element means and includes the element being directly on top of, adjacent to (e.g., laterally adjacent to, vertically adjacent to), underneath, or in direct contact with the other element. It also includes the element being indirectly on top of, adjacent to (e.g., laterally adjacent to, vertically adjacent to), underneath, or near the other element, with other elements present therebetween. In contrast, when an element is referred to as being "directly on" or "directly adjacent to" another element, no intervening elements are present.

As used herein, the terms "selectively removable" or "selectively etchable" mean and include a material that exhibits a greater etch rate responsive to exposure to a given etch chemistry and/or process conditions relative to another material exposed to the same etch chemistry and/or process conditions. For example, the material may exhibit an etch rate that is at least about five times greater than the etch rate of another material, such as an etch rate of about ten times greater, about twenty times greater, or about forty times greater than the etch rate of the another material. The etch selectivity between materials may be achieved by selecting materials of different chemical compositions or by using materials of similar chemical compositions and different dopants or dopant concentrations. Etch chemistries and etch conditions for selectively etching a desired material may be selected by a person of ordinary skill in the art.

As used herein, the term "substantially" in reference to a given parameter, property, or condition means and includes to a degree that one of ordinary skill in the art would understand that the given parameter, property, or condition is met with a degree of variance, such as within acceptable manufacturing tolerances. By way of example, depending on the particular parameter, property, or condition that is substantially met, the parameter, property, or condition may be at least 90.0% met, at least 95.0% met, at least 99.0% met, or even at least 99.9% met.

As used herein, the term "substrate" means and includes a material (e.g., a base material) or construction upon which additional materials are formed. The substrate may be a an electronic substrate, a semiconductor substrate, a base semiconductor layer on a supporting structure, an electrode, an electronic substrate having one or more materials, layers, structures, or regions formed thereon, or a semiconductor substrate having one or more materials, layers, structures, or regions formed thereon. The materials on the electronic substrate or semiconductor substrate may include, but are not limited to, semiconductive materials, insulating materials, conductive materials, etc. The substrate may be a conventional silicon substrate or other bulk substrate comprising a layer of semiconductive material. As used herein, the term "bulk substrate" means and includes not only silicon wafers, but also silicon-on-insulator ("SOI") substrates, such as silicon-on-sapphire ("SOS") substrates and silicon-on-glass ("SOG") substrates, epitaxial layers of silicon on a base semiconductor foundation, and other semiconductor or optoelectronic materials, such as silicon-germanium, germanium, gallium arsenide, gallium nitride, and indium phosphide. The substrate may be doped or undoped.

As used herein, the terms "vertical," "longitudinal," "horizontal," and "lateral" are in reference to a major plane of a structure and are not necessarily defined by Earth's gravitational field. A "horizontal" or "lateral" direction is a direction that is substantially parallel to the major plane of the structure, while a "vertical" or "longitudinal" direction is a direction that is substantially perpendicular to the major plane of the structure. The major plane of the structure is defined by a surface of the structure having a relatively large area compared to other surfaces of the structure.

Figure 1B:
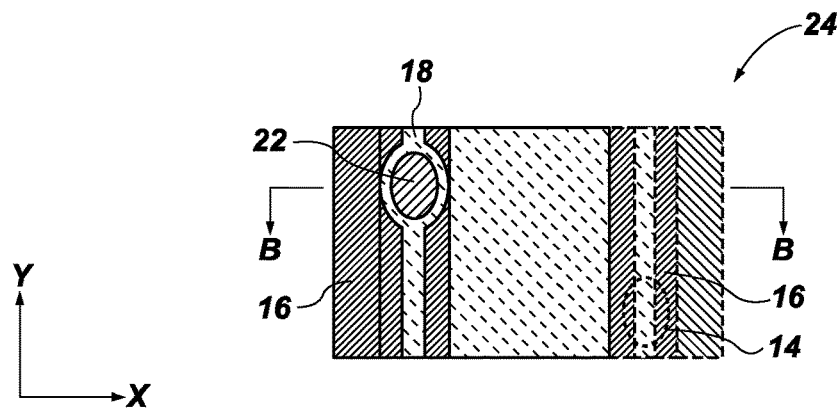
FIGS. 1B, 2B, and 3B are top down views, taken along the line A-A in FIGS. 1A, 2A, and 3A, respectively, of the electronic devices including the multilevel bitlines according to embodiments of the disclosure.
Figure 1C:
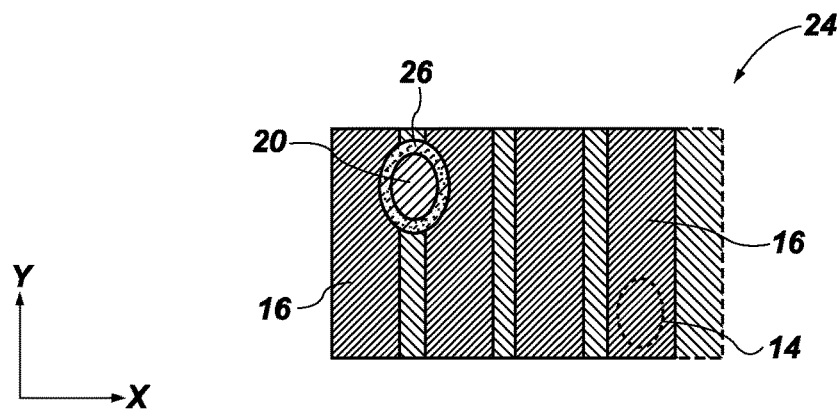
FIG. 1C is a top down view, taken along the line C-C in FIG. 1A, of the electronic devices including the multilevel bitlines according to embodiments of the disclosure.

An electronic device 24 including L1 contacts 14, multilevel bitlines 16, 22, L2 contacts 20, and liner 26 is shown in FIGS. 1A and 1B. The electronic device 24 includes multiple blocks (not shown) and subblocks (not shown), with multiple blocks being present. The electronic device 24 includes L1 bitlines 16 adjacent to (e.g., over) a base material (not shown), and L2 bitlines 22 adjacent to (e.g., over) the L1 bitlines 16. The L1 bitlines 16 are proximal to the base material and the L2 bitlines 22 are distal to the base material. The L1 bitlines 16 and the L2 bitlines 22 are equally spaced from one another and run parallel to one another in the horizontal direction (e.g., depth direction) of FIG. 1A. The L1 bitlines 16 are separated from one another in a horizontal direction by one or more dielectric materials (e.g., a first dielectric material 6, a second dielectric material 8), the liner 26, and a lower portion of the L2 contacts 20. While FIGS. 1A and 1B illustrate a single dielectric material 8 around the L1 contacts 14, multiple (e.g., two) dielectric materials may be present as described in relation to FIGS. 4A-7B. The L2 bitlines 22 are separated from one another in the horizontal direction by a third dielectric material 18. The L1 contacts 14, the L1 bitlines 16, and the first and second dielectric materials 6, 8 form a first level (e.g., a first deck) of the electronic device 24. The L2 bitlines 22, the third dielectric material 18, and an upper portion of the L2 contacts 20 form a second level (e.g., a second deck) of the electronic device 24 adjacent to (e.g., over) the first level. A lower portion of the L2 contacts 20 extends into the first level. The L2 contacts 20 exhibit a greater length than a length of the L1 contacts 14 since the L2 contacts 20 extend through the first and second decks of the electronic device 24. The L2 bitlines 22 may exhibit greater dimensions (e.g., greater widths) relative to the widths of the L2 contacts 20, providing an increased width (e.g., surface area) of the L2 bitlines 22. While two levels of bitlines are described and illustrated, two or more levels of bitlines may be present in the electronic device 24.

The L1 bitlines 16 are present at a single level, L1 and are continuous (e.g., extend substantially continuously) in a horizontal (e.g., x) direction. Each of the L1 contacts 14 may be configured to be in electrical contact (e.g., electrical connection) with alternate (e.g., every other) L1 bitlines 16. A portion of each of the L1 bitlines 16 directly contacts the L1 contacts 14, electrically connecting the L1 bitlines 16 to the pillar contacts. Therefore, each L1 contact 14 is electrically connected to one (e.g., a single) L1 bitline 16 in the subblock. The L1 bitlines 16 are also electrically connected to wordlines 1905 (see FIG. 19). Each of the L1 bitlines 16 may be formed at substantially the same pitch and exhibit substantially the same critical dimension (CD) as one another. The pitch of the L1 bitlines 16 may range from about 40 nm to about 75 nm, such as from about 45 nm to about 75 nm, from about 50 nm to about 75 nm, from about 60 nm to about 75 nm, from about 65 nm to about 75 nm, or from about 70 nm to about 75 nm. The L1 bitlines 16 are equally spaced from one another in the horizontal direction, and spaces between the laterally adjacent L1 bitlines 16 exhibit substantially the same dimensions as one another. However, the CD of the L1 bitlines 16 may be different than the CD of the spaces between the L1 bitlines 16. A width (e.g., the CD) of the L1 bitlines 16 may be selected depending on desired electrical performance characteristics of the electronic device 24 containing the L1 bitlines 16. The CD of the L1 bitlines 16 may substantially correspond to (e.g., be substantially the same as) a width of the L1 contacts 14. However, the width of the L1 bitlines 16 may be greater than (e.g., slightly greater than) or less than (e.g., slightly less than) the width of the L1 contacts 14, depending on the desired electrical performance characteristics of the electronic device 24 containing the L1 bitlines 16. The width of the first bitlines 16 may range from about 15 nm to about 40 nm, such as from about 15 nm to about 30 nm, from about 20 nm to about 30 nm, from about 15 nm to about 35 nm, or from about 15 nm to about 25 nm.

Figure 19:
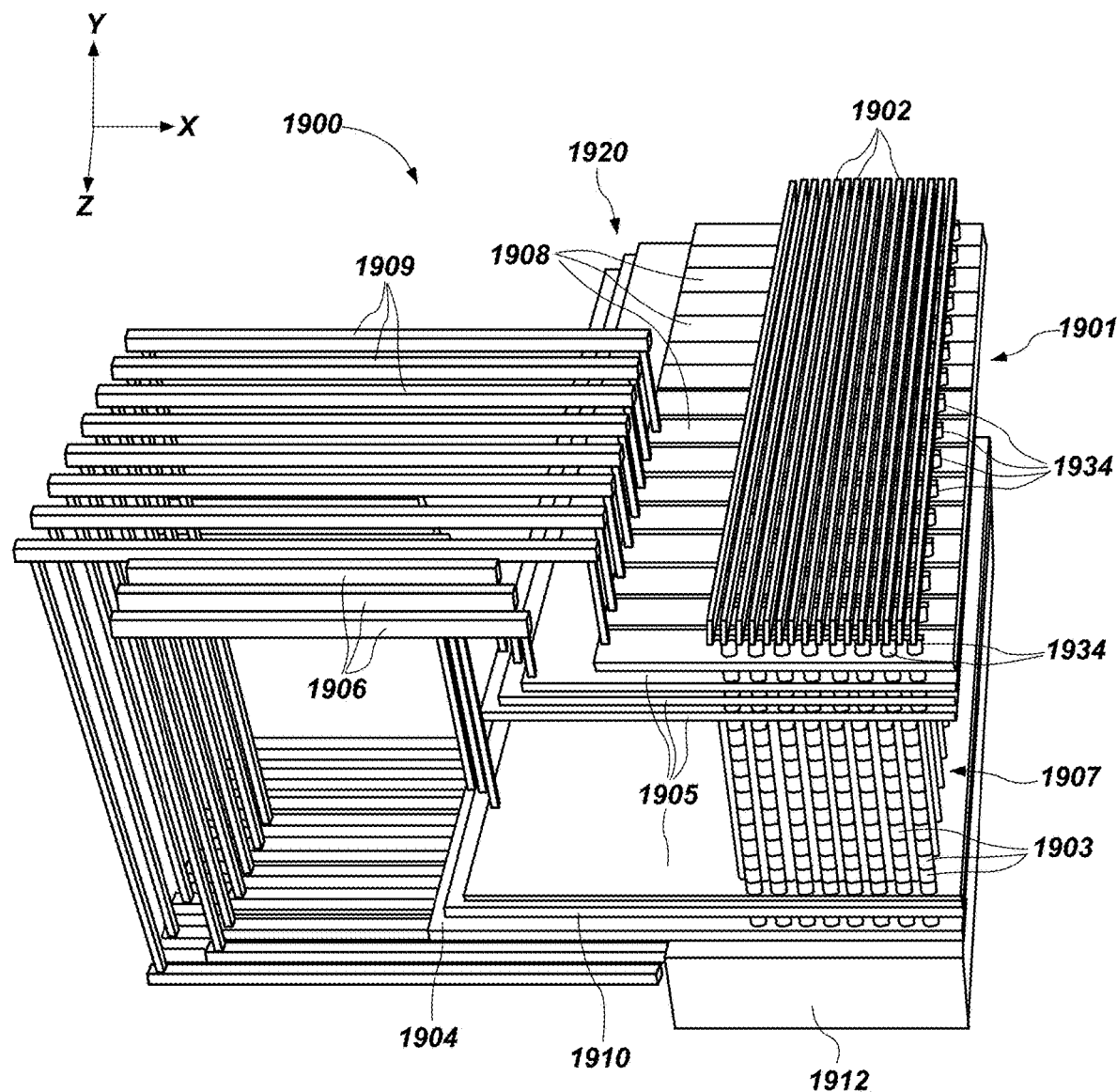
FIG. 19 is a partial cutaway perspective view of a portion of an electronic device including the multilevel bitlines according to embodiments of the disclosure.

The L2 bitlines 22 are present at a single level, L2, and are electrically connected to the L2 contacts 20 and to vertical strings 1907 (see FIG. 19). A portion of each of the L2 bitlines 22 may directly contact the L2 contacts 20, electrically connecting the L2 bitlines 22 to the pillar contacts. Each L2 contact 20 is electrically connected to one (e.g., a single) second bitline 22 in the subblock. The L2 bitlines 22 are continuous in the horizontal direction of FIG. 1A. The L2 bitlines 22 are also electrically connected to wordlines 1905 (see FIG. 19), with a portion of level 2 used as routing 1906. Each of the L2 bitlines 22 may be formed at substantially the same pitch and exhibit substantially the same CD, with the pitch and CD within the ranges disclosed above for the L1 bitlines 16. The L2 bitlines 22 are equally spaced from one another in the horizontal direction, and spaces between the L2 bitlines 22 exhibit substantially the same dimensions as one another. However, the CD of the L2 bitlines 22 may be different than the CD of the spaces between the L2 bitlines 22. A width of the L2 bitlines 22 may substantially correspond to a width of the L2 contacts 20. However, the width of the L2 bitlines 22 may be greater than (e.g., slightly greater than) or less than (e.g., slightly less than) the width of the L2 contacts 20, depending on the desired electrical performance characteristics of the electronic device 24 containing the L1 bitlines 16 and the L2 bitlines 22.

The L1 contacts 14, the L1 bitlines 16, the L2 contacts 20, and the L2 bitlines 22 are not all visible in the same cross-sectional views. Therefore, in FIG. 1A, and other drawings, solid lines are used to indicate the rightmost L1 contact 14 and L1 bitline 16, and dashed lines are used to indicate the other L1 contacts 14 and L1 bitlines 16. In FIG. 1A, one L1 contact 14 and one L1 bitline 16 (the rightmost L1 contact 14 and L1 bitline 16) are in the foreground of this cross-sectional view while the remaining L1 contacts 14 and L1 bitlines 16 are in the background of this cross-sectional view. Similarly, one L2 contact 20 and one L2 bitline 22 (the leftmost L2 contact 20 and L2 bitline 22) are in the foreground of this cross-sectional view while the remaining L2 contacts 20 and L2 bitlines 22 are in the background of this cross-sectional view. In FIG. 1A and other drawings, some of the L1 contacts 14 and the L1 bitlines 16 are shown using dashed lines, indicating these structures are offset (e.g., laterally offset) in a y direction relative to the L1 contact 14 and the L1 bitline 16 that are shown using solid lines. Some of the L2 contacts 20 and the L2 bitlines 22 are shown using dashed lines, indicating these structures are offset in the y direction relative to the L2 contact 20 and the L2 bitline 22 that are shown using solid lines. For simplicity in the top down view of FIG. 1B, some materials are omitted for clarity. In other words, not all of the L1 contacts 14, L1 bitlines 16, L2 contacts 20, and L2 bitlines 22 are shown in FIG. 1B.

The liner 26 surrounds the L2 contacts 20, isolating the L2 contacts 20 from the L1 bitlines 16 and the L1 contacts 14. The liner 26 extends a height $H_1$ (an entire height) of the L2 contacts 20. The liner 26, thus, is substantially coextensive with the L2 contacts 20 along its entire height (i.e., the z direction). The L1 contacts 14 are separated from one another by the second dielectric material 8, a lower portion of the liner 26, and the lower portion of the L2 contacts 20. The L2 contacts 20 are separated from one another by the third dielectric material 18 and an upper portion of the liner 26. The L1 bitlines 16 are equally spaced from one another in the horizontal direction (i.e., the x direction) and exhibit a height $H_2$. The L2 bitlines 22 are equally spaced from one another in the horizontal direction. The L1 contacts 14 are equally spaced from one another in the horizontal direction, and the L2 contacts 20 are equally spaced from one another in the horizontal direction.

The L1 contacts 14 and the L2 contacts 20 electrically connect the L1 bitlines 16 and the L2 bitlines 22, respectively, to pillar contacts (not shown in FIGS. 1A and 1B) below the L1 bitlines 16. The L1 contacts 14 are adjacent to (e.g., over) the pillar contacts, which are adjacent to (e.g., over) the base material. The pillar contacts may be formed in an underlying dielectric material (not shown) that separates horizontally adjacent pillar contacts from one another. The pillar contacts may, for example, be configured to electrically connect to pillars (e.g., memory pillars, memory strings, channel strings) (not shown) adjacent to (e.g., below) the pillar contacts and to the overlying L1 contacts 14 and the L1 bitlines 16. The pillar contacts may be adjacent to (e.g., vertically adjacent to, on) and in direct electrical contact with contact plugs (not shown) of the pillars, electrically connecting the pillars to the pillar contacts. The pillars are present in tiers (not shown in FIGS. 1A and 1B) of alternating dielectric materials and conductive materials on the base material (e.g., a substrate). The pillars may, for example, be memory pillars and include a channel material of a cell film surrounding a fill material. The cell film may include a cell material and the channel material is formed adjacent to (e.g., around) the cell material. The cell material and the channel material in the tiers define memory cells of the electronic device 24. Alternatively, one or more of the pillars in the electronic device 24 may be dummy pillars.

By including the liner 26 around the L2 contacts 20, the L1 bitlines 16 may be electrically isolated from one another and from the L2 contacts 20. Therefore, shorting between adjacent conductive features, such as between the L2 contacts 20, the L2 bitlines 22, and the L1 bitlines 16, is reduced (e.g., minimized) compared to conventional electronic devices lacking such a liner 26. In addition, the L1 bitlines 16 may exhibit greater dimensions (e.g., greater widths) than conventional L1 bitlines since the L1 bitlines 16 may partially overlap with the L2 bitlines 22 and the L2 contacts 20. In other words, spacing of the L1 bitlines 16 may be narrower than a diameter of the L2 contacts 20. The greater dimensions of the L1 bitlines 16 correspond to lower resistance between adjacent L1 bitlines 16. The L2 bitlines 22 may exhibit greater dimensions (e.g., greater widths) relative to the widths of the L2 contacts 20, providing an increased surface area of the L2 bitlines 22.

Figure 2A:
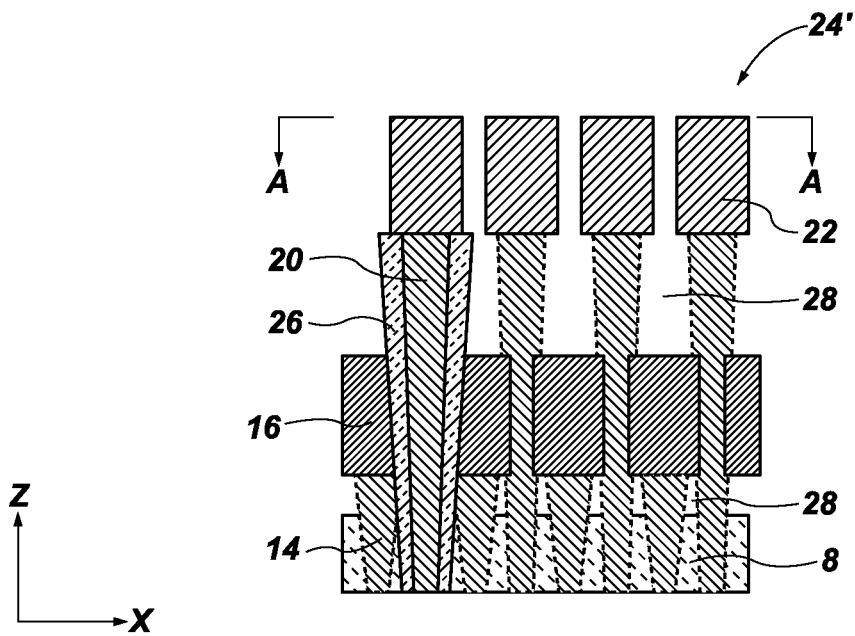
Figure 2B:
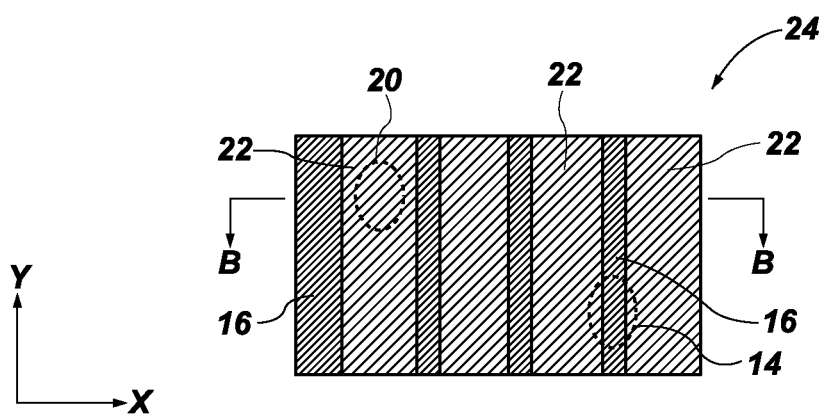

An electronic device 24' including the L1 contacts 14, the L1 bitlines 16, the L2 contacts 20, the L2 bitlines 22, and the liner 26 is shown in FIGS. 2A and 2B. The electronic device 24' is similar to the electronic device 24 except that air gaps 28 are adjacent to (e.g., laterally adjacent to) one or more of the L1 contacts 14, the L1 bitlines 16, the L2 contacts 20, or the L2 bitlines 22. In other words, the air gaps 28 replace at least a portion of the second and third dielectric materials 8, 18 that are present in the electronic device 24. The liner 26 may substantially completely surround the L2 contacts 20, providing stability to the electronic device 24' and separating the L2 contacts 20 from other conductive materials of the electronic device 24'. The liner 26 extends along substantially an entire height of (e.g., is substantially coextensive with) the L2 contacts 20. The L2 bitlines 22 may exhibit greater dimensions (e.g., greater widths) relative to the widths of the L2 contacts 20, providing an increased width (e.g., surface area) of the L2 bitlines 22. Features (e.g., materials and structures) and method acts of forming of the electronic device 24' that are substantially similar to those of the electronic device 24 are as described above. Features and method acts that differ from those described above are further described below.

Similar to FIGS. 1A and 1B, the L1 contacts 14, the L1 bitlines 16, the L2 contacts 20, and the L2 bitlines 22 in FIGS. 2A and 2B are not all visible in the same cross-sectional views. In FIG. 2A and other drawings, solid lines are used to indicate the rightmost L1 contact 14 and L1 bitline 16 and dashed lines are used to indicate the other L1 contacts 14 and L1 bitlines 16. In FIG. 2A, one L1 contact 14 and one L1 bitline 16 (the rightmost L1 contact 14 and L1 bitline 16) are in the foreground of this cross-sectional view while the remaining L1 contacts 14 and L1 bitlines 16 are in the background of this cross-sectional view. Similarly, one L2 contact 20 and one L2 bitline 22 (the leftmost L2 contact 20 and L2 bitline 22) are in the foreground of this cross-sectional view while the remaining L2 contacts 20 and L2 bitlines 22 are in the background of this cross-sectional view. In FIG. 2A, some of the L1 contacts 14 and the L1 bitlines 16 are shown using dashed lines, indicating these structures are offset (e.g., laterally offset) in a y direction relative to the L1 contact 14 and the L1 bitline 16 that are shown using solid lines. Some of the L2 contacts 20 and the L2 bitlines 22 are shown using dashed lines, indicating these structures are offset in the y direction relative to the L2 contact 20 and the L2 bitline 22 that are shown using solid lines. For simplicity in the top down view of FIG. 2B, some materials are omitted for clarity. In other words, not all of the L1 contacts 14, L1 bitlines 16, L2 contacts 20, and L2 bitlines 22 are shown in FIG. 2B.

Figure 3A:
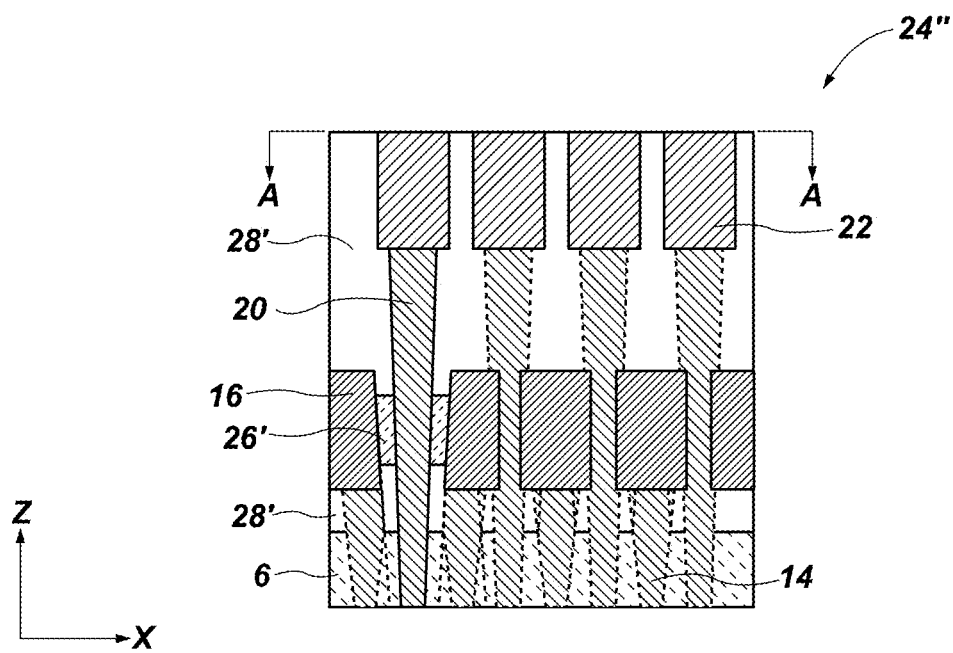
Figure 3B:
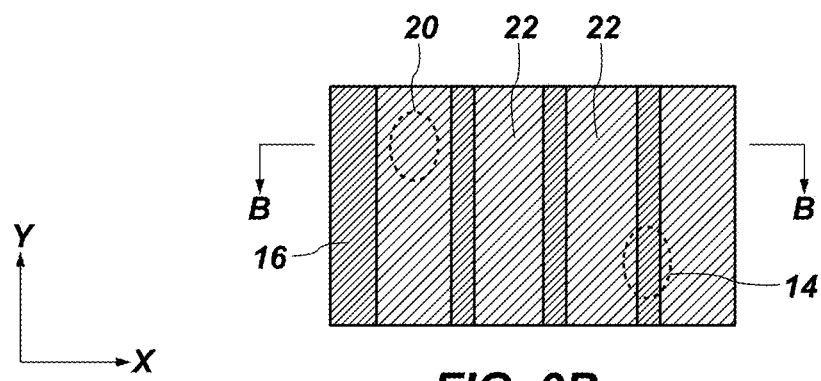

While electronic device 24' includes the liner 26, an electronic device 24'' including only a portion of the liner 26' is shown in FIGS. 3A and 3B. Features (e.g., materials and structures) and method acts of forming of the electronic device 24'' that are substantially similar to those of the electronic device 24 are as described above. Features and method acts that differ from those described above are further described below. A portion of the liner 26 may be removed such that only the liner 26' remains, producing the electronic device 24''. By way of example only, the portion of the liner 26 may be removed such that the liner 26' is only present adjacent to (e.g., laterally adjacent to) the L1 bitlines 16. The liner 26' extends along only a portion of the L2 contacts 20. In other words, the liner 26' extends a distance that is less than the height $H_1$ of the L2 contacts 20 and less than the height $H_2$ of the L1 bitlines 16. The L2 bitlines 22 may exhibit greater dimensions (e.g., greater widths) relative to the widths of the L2 contacts 20, providing an increased surface area of the L2 bitlines 22. As in other drawings, dashed lines are used to indicate structures that are offset (e.g., laterally offset) in a y direction relative to structures that are shown using solid lines. In FIGS. 3A and 3B, solid lines are used to indicate the rightmost L1 contact 14 and L1 bitline 16 in the foreground and dashed lines are used to indicate the other L1 contacts 14 and L1 bitlines 16 in the background. Solid lines are used to indicate the leftmost L2 contact 20 and L2 bitline 22 in the foreground and dashed lines are used to indicate the other L2 contacts 20 and L2 bitlines 22 in the background.

A method of forming the electronic device 24 is shown in FIGS. 4A-7B. The L1 contacts 14 are formed in a first dielectric material 6 and a second dielectric material 8 of the first level and the L1 bitlines 16 are formed in the second dielectric material 8 of the first level as shown in FIGS. 4A and 4B. The L1 contacts 14 are formed by conventional techniques, such as by forming openings 10 in the first dielectric material 6 and the second dielectric material 8 and forming a conductive material in the openings 10. The first dielectric material 6 and the second dielectric material 8 (or the single dielectric material 8) may be formed at a thickness sufficient to provide desired dimensions of the subsequently-formed L1 contacts 14. The openings 10 are formed by conventional photolithography and removal techniques. The L1 contacts 14 extend partially into the second dielectric material 8 and through the first dielectric material 6. The L1 contacts 14 are separated from one another by portions of the first dielectric material 6 and the second dielectric material 8. The L1 bitlines 16 are formed adjacent to (e.g., over) the L1 contacts 14. The L1 bitlines 16 are formed in the second dielectric material 8 by conventional techniques, such as by forming openings 12 in the second dielectric material 8 and forming a conductive material in the openings 12. The conductive material of the L1 bitlines 16 may be the same as or different than the conductive material of the L1 contacts 14. The openings 12 are formed by conventional photolithography and removal techniques. As shown in FIGS. 4A and 4B, the L1 contacts 14 are equally spaced from one another and the L1 bitlines 16 are equally spaced from one another.

The first dielectric material 6 and the second dielectric material 8 may be selected from one of the dielectric materials mentioned above. Each of the first dielectric material 6 and the second dielectric material 8 may be formed from an electrically insulative material, such as an electrically insulative oxide material. The first dielectric material 6 and the second dielectric material 8 may exhibit the same material (e.g., the same chemical composition) or a different material (e.g., a different chemical composition). Even if the first dielectric material 6 and the second dielectric material 8 are formed from the same chemical composition, the first dielectric material 6 and the second dielectric material 8 may be visually distinguishable if the first dielectric material 6 and the second dielectric material 8 are formed at different times (e.g., by different process acts). In some embodiments, the first dielectric material 6 and the second dielectric material 8 are different materials and are selected to be selectively etchable relative to one another or selectively etchable relative to other dielectric materials used to form the electronic device 24. While FIGS. 4A and 4B show forming the L1 contacts 14 and the L1 bitlines 16 in the first dielectric material 6 and the second dielectric material 8, the L1 contacts 14 and the L1 bitlines 16 may be formed in a single dielectric material 8.

Figure 5B:
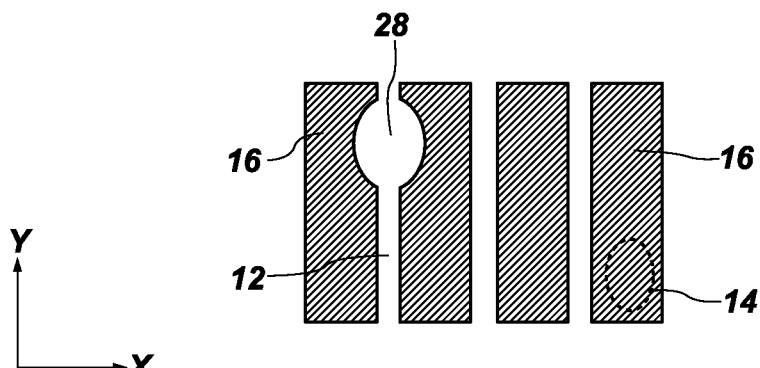

A third dielectric material 18 is formed over the first level and openings 31 are formed in the first, second, and third dielectric materials 6, 8, 18, as shown in FIGS. 5A and 5B. The L2 contacts 20 are formed in the openings 31. A thickness of the third dielectric material 18 defines the thickness of the second level in which the L2 bitlines and the L2 contacts 20 are formed. The third dielectric material 18 may, for example, be an interlayer dielectric material. The openings 31 are formed by conventional photolithography and removal techniques and extend through the first, second, and third dielectric materials 6, 8, 18. Sidewalls of the third dielectric material 18 define the openings 31 in which the liner 26 and the L2 contacts 20 are to be formed.

Figure 6A:
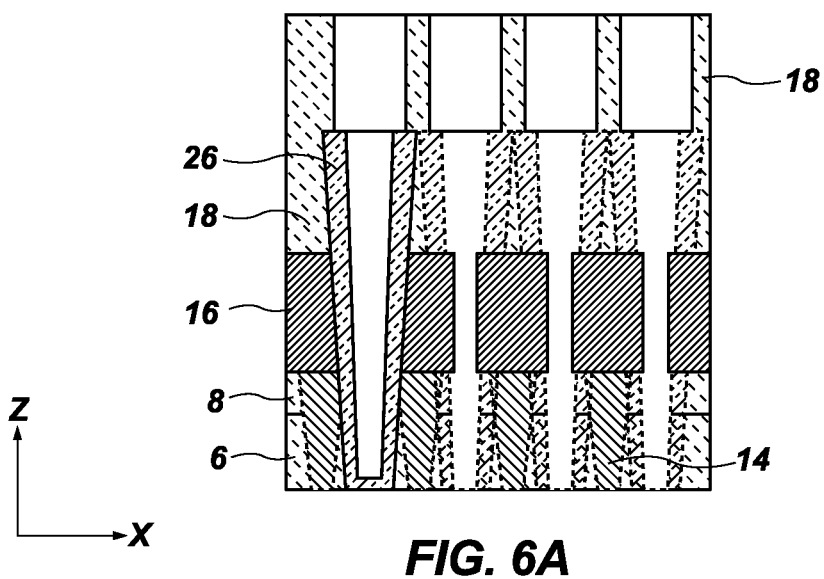
Figure 6B:
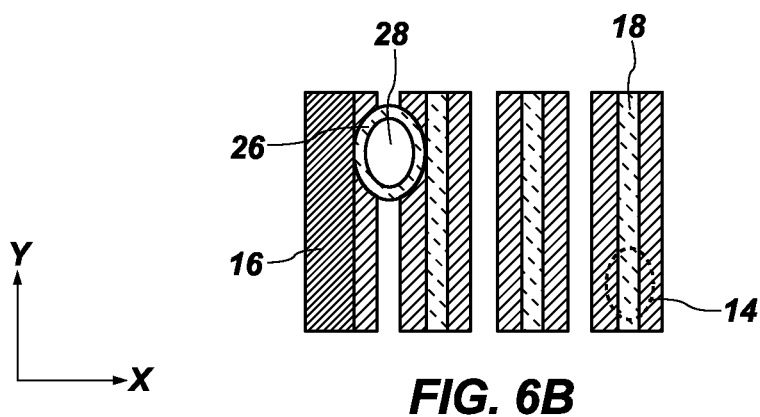

The liner 26 is formed in the openings 31, as shown in FIGS. 6A and 6B. The liner 26 may be formed of and include a dielectric material, such as silicon nitride. The liner 26 may be conformally formed in the openings 31, with a volume of the openings 31 remaining for subsequent formation of the L2 contacts 20. Since the liner 26 occupies a portion of the volume of the openings 31, the remaining volume to be occupied by the L2 contacts 20 may be reduced compared to the volume of the L2 contacts 20 if the liner 26 was not present. The liner 26 may initially be formed along the sidewalls of the third dielectric material 18, extending from an upper surface of the third dielectric material 18 to a lower surface of the first dielectric material 6. A portion of the liner 26 may subsequently be removed depending on a desired height of the L2 contacts 20.

Figure 7A:
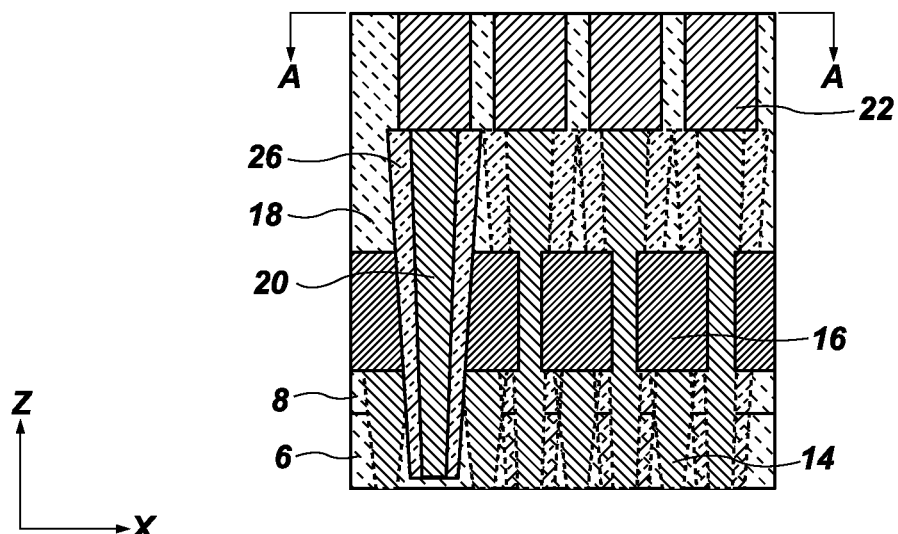
Figure 7B:
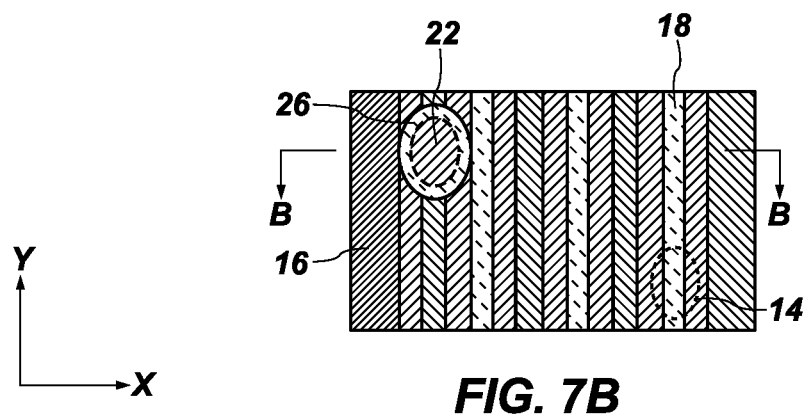

The L2 contacts 20 and the L2 bitlines 22 of the second level are formed, as shown in FIGS. 7A and 7B. A portion of the liner 26 at the bottom of the openings 31 is removed and a conductive material of the L2 contacts 20 is formed in the openings 31. The liner 26 at the bottom of the openings 31 may be removed by a so-called "punch etch" process. The conductive material of the L2 contacts 20 substantially fills the openings 31, with the liner 26 surrounding the L2 contacts 20. The L2 contacts 20 extend through the third dielectric material 18, the second dielectric material 8, and the first dielectric material 6. After forming the L2 contacts 20, additional openings (not shown) are formed, by conventional photolithography and removal techniques, such as by an anisotropic etching process. A conductive material is formed in the openings and adjacent to (e.g., over) the L2 contacts 20, forming the L2 bitlines 22 of the electronic device 24. The L2 bitlines 22 exhibit a greater width than a width of the adjacent portion of the L2 contacts 20, providing an increased surface area of the L2 bitlines 22. The electronic device 24 shown in FIGS. 7A and 7B is substantially the same as the electronic device 24 shown in FIGS. 1A and 1B except that first and second dielectric materials 6, 8 are illustrated in FIGS. 7A and 7B while a single dielectric material 8 is illustrated in FIGS. 1A and 1B. The conductive material of the L2 bitlines may be the same as or different than the conductive material of the L2 contacts 20.

Figure 8A:
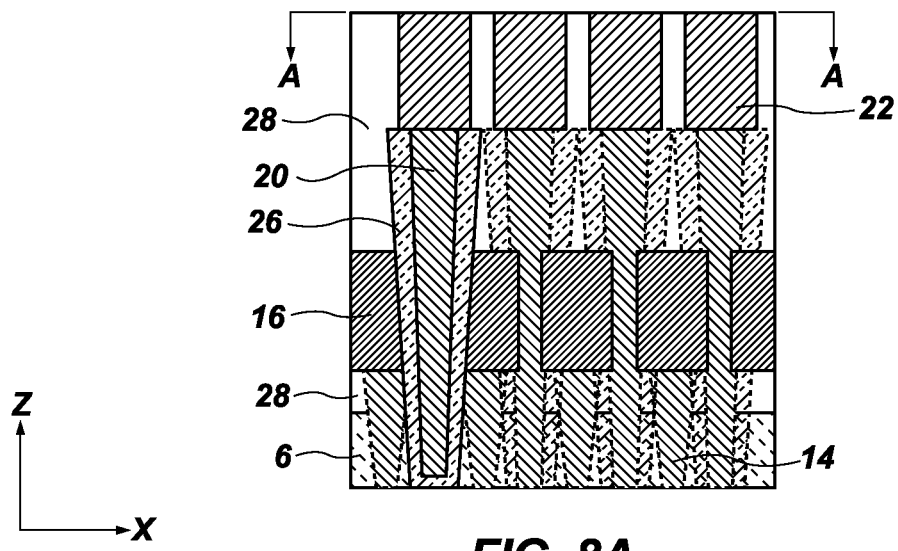
Figure 8B:
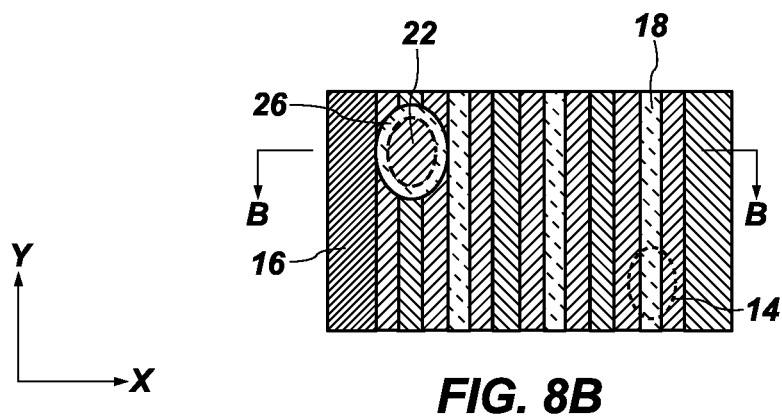

One or more electronic device 24 may be present in an apparatus. Alternatively, the electronic device 24 may be further processed to form the electronic device 24', one or more of which is present in an apparatus. The electronic device 24' including the air gaps 28 is formed by removing the second and third dielectric materials 8, 18, as shown in FIGS. 8A and 8B. The electronic device 24' differs from the electronic device 24 in that the air gaps 28 are present in place of the second and third dielectric materials 8, 18, with the air gaps 28 extending along at least a portion of the height of the L2 contacts 20. The third dielectric material 18 and the second dielectric material 8 may be removed by conventional techniques, forming the air gaps 28 between the L2 bitlines 22, the L2 contacts 20, the L1 bitlines 16, and the L1 contacts. The air gaps 28 may extend from an upper surface of the L2 bitlines 22 to below a lower surface of the L1 bitlines 16 and, optionally, into the first dielectric material 6. The third dielectric material 18 and the second dielectric material 8 may be selectively removed, by conventional techniques, relative to the conductive materials of the L1 bitlines 16 and the L2 bitlines 22, the L2 contacts 20, the L1 contacts 14, the liner 26, and the first dielectric material 6. During the selective removal of the third dielectric material 18 and the second dielectric material 8, substantially all of the conductive materials of the L1 bitlines 16, the L2 bitlines 22, the L2 contacts 20, and the L1 contacts 14 may remain.

The liner 26 and the first dielectric material 6 located laterally adjacent to the L2 contacts 20 may provide stability (e.g., structural stability) to the L2 contacts 20. If, however, the L2 contacts 20 are sufficiently stable, a portion of the first dielectric material 6 may, optionally, be removed by conventional techniques. The air gaps 28 may be extended into the first dielectric material 6 by selectively removing the portion of the first dielectric material 6 relative to the conductive materials of the L1 bitlines 16 and the L2 bitlines 22 and to the liner 26. While the liner 26 may contribute to higher capacitance of the electronic device 24', the air gaps 28 may compensate for the increase and achieve desired electrical performance of the electronic device 24'.

If only the liner 26' is to present adjacent to the L2 contacts 20, as shown in the electronic device 24" of FIGS. 3A and 3B, a portion of the liner 26 may be removed. The electronic device 24" differs from the electronic device 24' in that the air gaps 28' have a larger volume than the air gaps 28 due to the removal of the portion of the liner 26. The electronic device 24" differs from the electronic device 24 in that the air gaps 28' are present in place of the second and third dielectric materials 8, 18. The electronic device 24" differs from the electronic device 24' and the electronic device 24 in that the liner 26' is only laterally adjacent to the L2 contacts 20 proximal to the L1 bitlines 16. In other words, the liner 26' does not extend along the entire height of the L2 contacts 20. The liner 26' may, for example, extend a height less than the height $H_2$ of the L1 bitlines 16. While the liner 26' may contribute to higher capacitance of the electronic device 24", by increasing the volume of the air gaps 28', the desired electrical performance of the electronic device 24" may be achieved.

The electronic device 24' of FIGS. 8A and 8B may be further processed to form the electronic device 24" of FIGS. 3A and 3B. By way of example only, a portion of the liner 26 may be selectively removed relative to the conductive materials of the L1 bitlines 16 and the L2 bitlines 22, the L2 contacts 20, the L1 contacts 14, and the first dielectric material 6. The removal of the portion of the liner 26 increases the volume of the air gaps 28' compared to the air gaps 28 in the electronic device 24'. The portion of the liner 26 may be removed by conventional techniques.

The liner 26' may remain adjacent (e.g., laterally adjacent) to a portion of the L1 bitlines 16 and to a portion of the L2 contacts 20, providing stability (e.g., structural stability) and electrical isolation to the L2 contacts 20. As shown in FIGS. 3A and 3B, upper and lower surfaces of the liner 26' are recessed relative to upper and lower surfaces of the L1 bitlines 16. However, the upper and lower surfaces of the liner 26' may be substantially coplanar with the upper and lower surfaces of the L1 bitlines 16 or may extend slightly above and slightly below the upper and lower surfaces of the L1 bitlines 16. The amount of liner 26' remaining proximal to the L1 bitlines 16 may depend on the degree of stability to be provided to the L2 contacts 20 and/or the degree of isolation to be achieved between the L2 contacts 20 and other conductive components of the electronic device 24". The remaining amount of the liner 26' may be tailored by adjusting the conditions (e.g., the etch conditions) used to remove the portion of the liner 26. By tailoring the liner 26', the air gaps 28' are correspondingly tailored to achieve desired properties of the electronic device 24".

Additional electronic devices 24'" and 24"" (see FIGS. 17A-18B) are also disclosed and are similar to the electronic devices 24, 24', 24". The electronic devices 24'" and 24"" include L1 contacts 14, L1 bitlines 16, L2 contacts 20, and L2 bitlines 22. The electronic device 24"" also includes air gaps 28. Methods of forming the electronic devices 24'" and 24"" (see FIGS. 17A-18B) are shown in FIGS. 9A-16B and may be used to substantially reduce or prevent misalignment of the first and second levels (e.g., the first and second decks) of the electronic devices 24'" and 24"". Features (e.g., materials and structures) and method acts of forming the electronic devices 24'" and 24"" that are substantially similar to those of the electronic devices 24, 24', 24" are as described above. Features and method acts that differ from those described above are further described below. While the electronic devices 24'" and 24"" are described and illustrated without a liner 26, the liner 26 may be present.

Figure 9A:
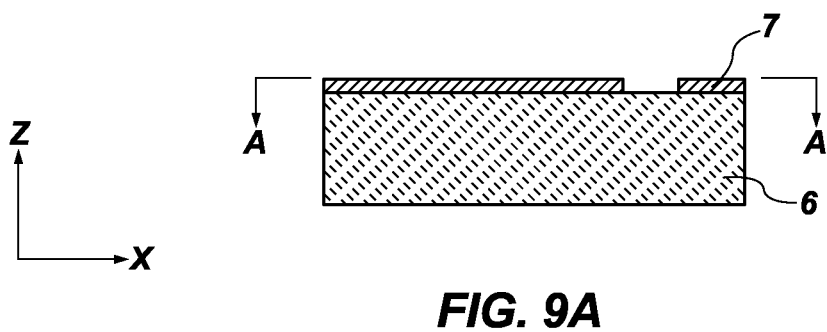
FIGS. 9A-16B are cross-sectional and top down views illustrating the formation of electronic devices including multilevel bitlines according to additional embodiments of the disclosure.
Figure 9B:
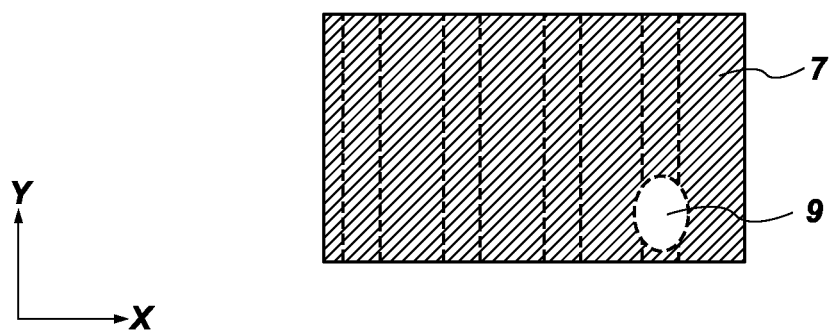

As shown in FIGS. 9A and 9B, a first dielectric material 6 and a fourth dielectric material 7 may be formed and patterned. The first dielectric material 6 and the fourth dielectric material 7 may be one of the dielectric materials previously discussed and are selected to exhibit etch selectivity. In some embodiments, the first dielectric material 6 is silicon oxide and the fourth dielectric material 7 is silicon nitride. Openings 9 are formed through the fourth dielectric material 7 to expose locations in the first dielectric material 6 where L1 contacts 14 (see FIGS. 11A and 11B) are ultimately to be formed. The openings 9 may be formed by conventional photolithography and removal techniques. In FIGS. 9A and 9B, a single material is shown as the first dielectric material 6. However, two or more materials may be used, such as first dielectric material 6 and second dielectric material 8.

Figure 10A:
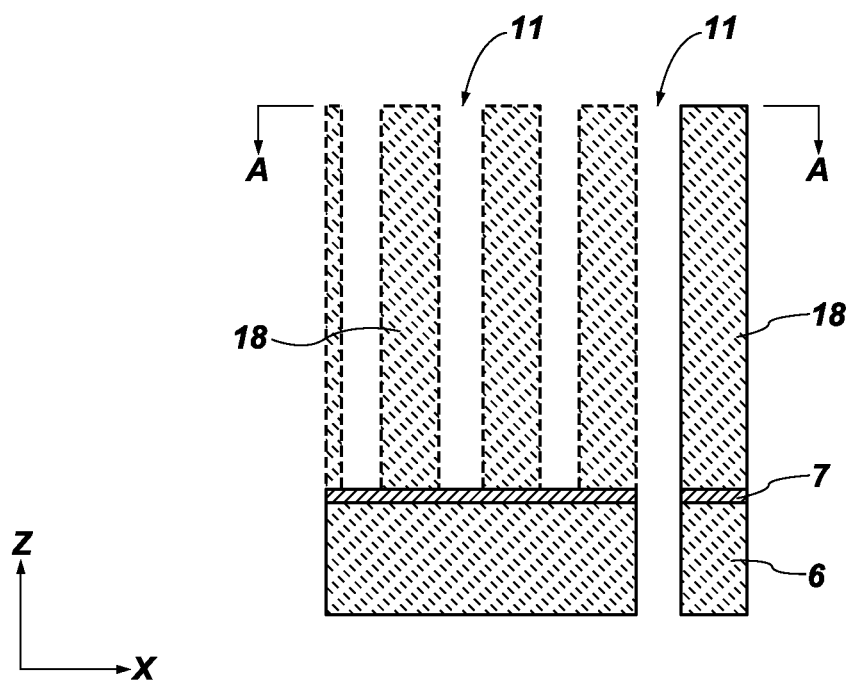
Figure 10B:
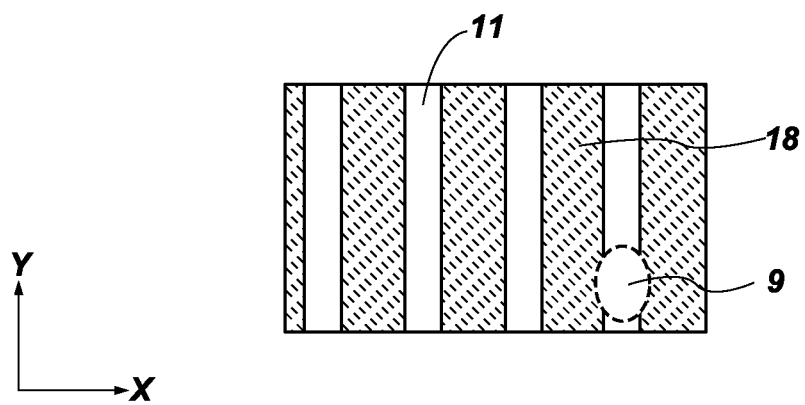

A third dielectric material 18 is formed over the first dielectric material 6 and the fourth dielectric material 7 and openings 11 are formed into and through the first dielectric material 6, as shown in FIGS. 10A and 10B. The third dielectric material 18 may be one of the dielectric materials previously discussed. In some embodiments, the third dielectric material 18 is an interlayer dielectric material. The openings 11 are formed in locations where L1 bitlines 16 (see FIGS. 11A and 11B) are ultimately to be formed. In some locations, the openings 11 are formed through the third dielectric material 18 and through the first dielectric material 6. The openings 11 may be formed by conventional photolithography and removal techniques. The openings 11 that extend into and through the first dielectric material 6 are formed in locations where the L1 contacts 14 and the L1 bitlines 16 (see FIGS. 11A and 11B) are ultimately to be formed.

Figure 11A:
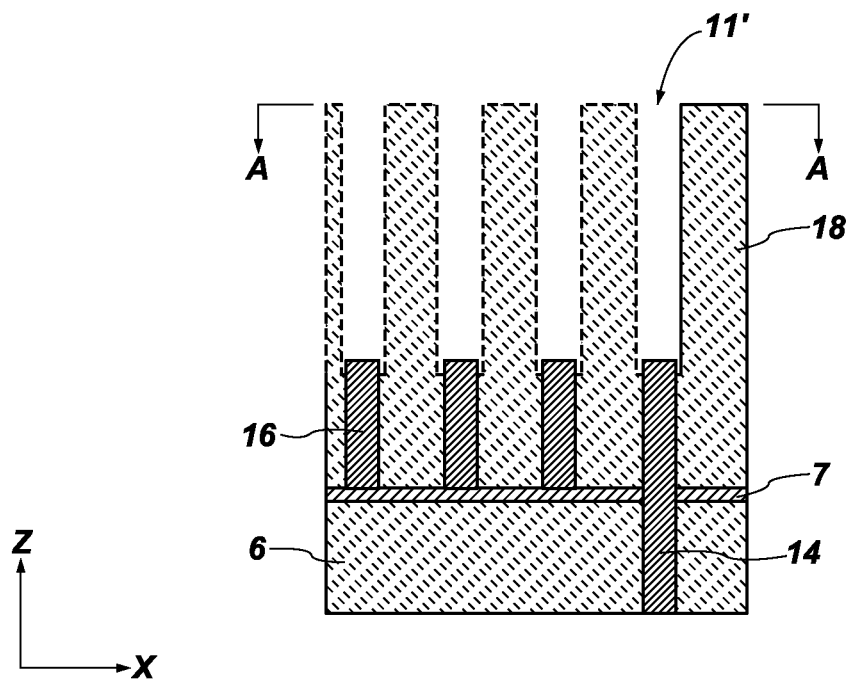
Figure 11B:
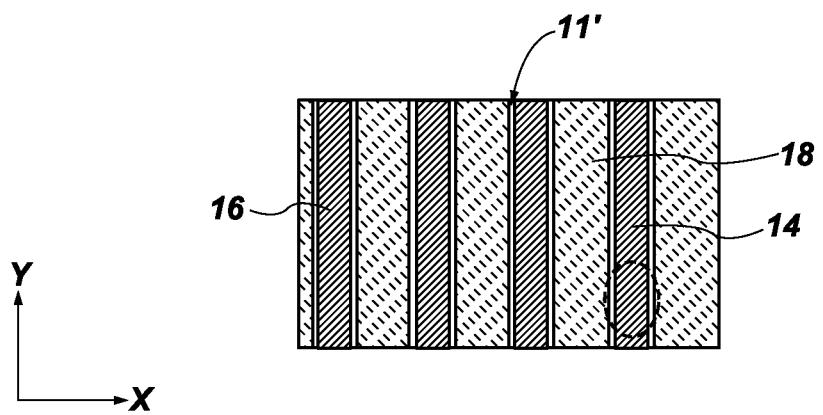

One or more conductive materials of the L1 contacts 14 and the L1 bitlines 16 are formed in the openings 11, as shown in FIGS. 11A and 11B. The conductive material may be one or more of the conductive materials previously discussed. In some embodiments, the conductive material of the L1 contacts 14 and the L1 bitlines 16 is tungsten and titanium nitride is used as a liner for the tungsten of the L1 bitlines 16. However, in other embodiments, different conductive materials may be used for the L1 contacts 14 and the L1 bitlines 16. The conductive material may be formed by conventional techniques, at least partially filling the openings 11 to form the L1 contacts 14 and the L1 bitlines 16. If the openings 11 are substantially filled with the conductive material, a portion of the conductive material is removed to recess the conductive material and form the L1 contacts 14 and the L1 bitlines 16. A portion of the third dielectric material 18 may then be removed, widening the openings 11 to form openings 11' and to expose upper sidewalls of the L1 bitlines 16. A desired portion of the third dielectric material 18 may be removed by conventional techniques, such as by a wet etch process. The increased width of the openings 11' enables a width at which the L2 bitlines 22 and L2 contacts 20 (see FIGS. 15A and 15B) are formed to be narrower than a spacing of the L1 bitlines 16 and reduces or prevents shorting between the L1 contacts 14, the L1 bitlines 16, the L2 bitlines 22, and the L2 contacts 20.

Figure 12A:
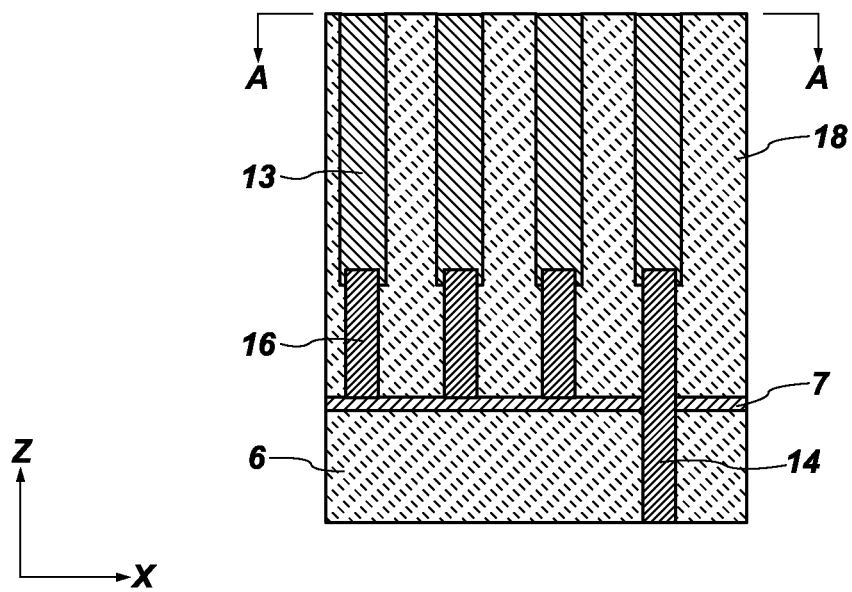
Figure 12B:
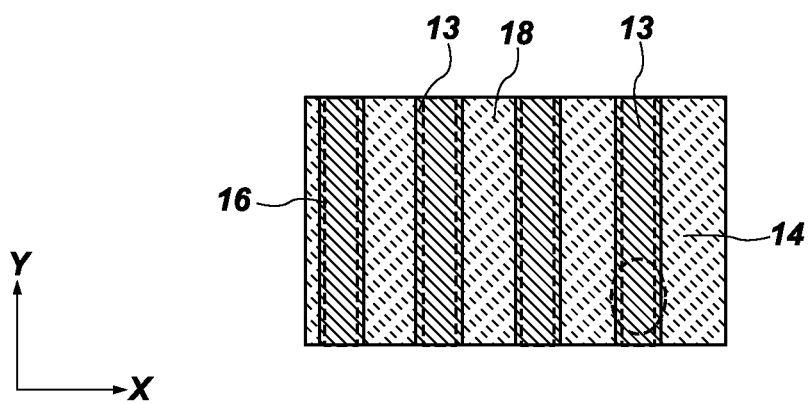

As shown in FIGS. 12A and 12B, a cap material 13 may be formed in the openings 11'. Since the openings 11' are wider than the openings 11 in which the L1 bitlines 16 are formed, the cap material 13 formed over the L1 bitlines 16 exhibits a greater width than a width of the L1 bitlines 16. The cap material 13 may be a dielectric material. In some embodiments, the cap material 13 is silicon nitride. Excess cap material 13 formed over an upper surface of the third dielectric material 18 may be removed, such as by a CMP process. An upper surface of the cap material 13 may be substantially coplanar with the upper surface of the third dielectric material 18. The cap material 13 protects the underlying L1 bitlines 16 during formation of the L2 contacts 20 and L2 bitlines 22.

Figure 13A:
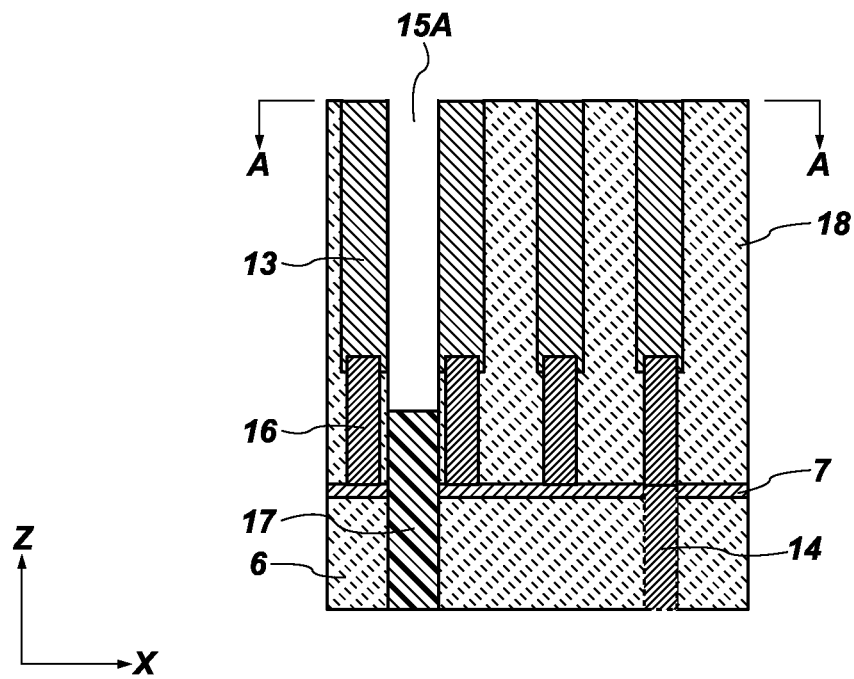
Figure 13B:
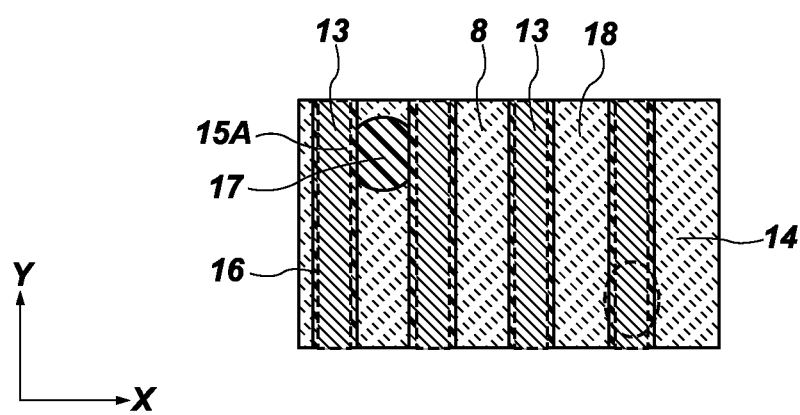
Figure 14A:
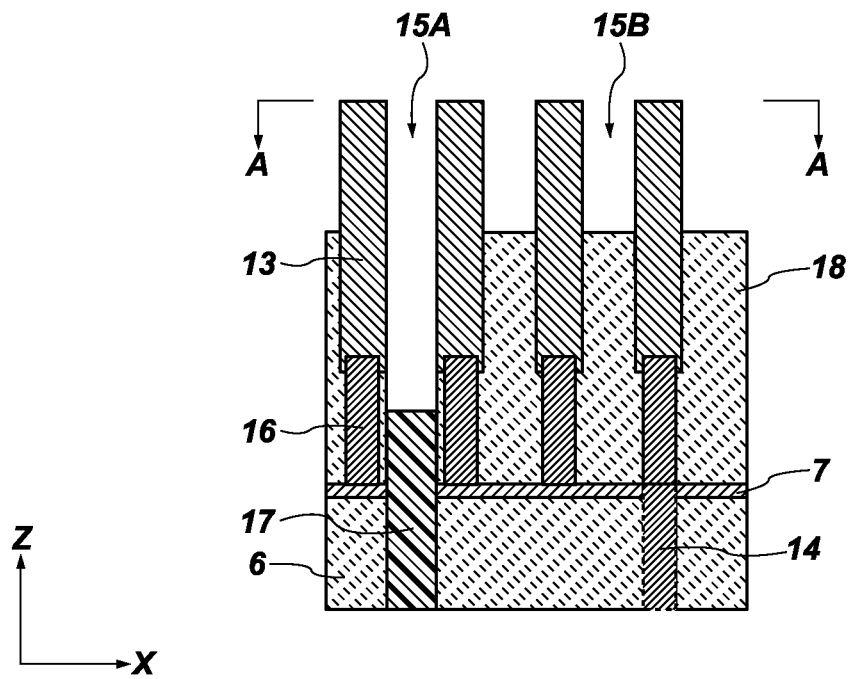
Figure 14B:
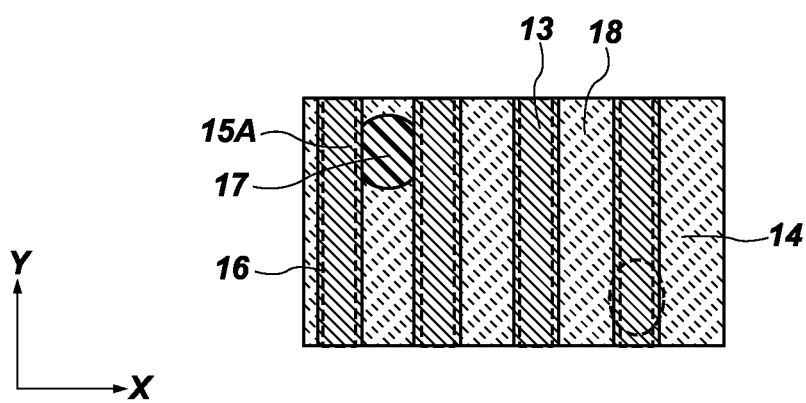

To form the L2 contacts 20 and L2 bitlines 22, openings 15 (15A, 15B) are formed in the third dielectric material 18 as shown in FIGS. 13A-14B. The openings 15 may be formed by conducting multiple photolithography and removal acts. By way of example only, the openings 15 may be formed by a dry etch process. The openings 15A are formed through the third dielectric material 18 and the first dielectric material 6 in locations where the L2 contacts 20 are ultimately to be formed, as shown in FIGS. 13A and 13B. The openings 15A may be formed by conventional techniques, such as by conducting a reactive ion etch (RIE) process. A sacrificial material 17, such as a resist material, is formed in the openings 15A to protect materials underlying the sacrificial material 17 while the openings 15B are formed. The sacrificial material 17 may at least partially fill the openings 15A. If the sacrificial material 17 substantially fills the openings 15A, a portion of the sacrificial material 17 may be removed to recess the sacrificial material 17 in the openings 15A. As shown in FIGS. 14A and 14B, the openings 15B are formed in locations where the L2 bitlines 22 are ultimately to be formed. The openings 15B may be formed by conventional techniques, such as by conventional selective reactive ion etching techniques. Conventional photolithography techniques may be used to protect other portions of the memory array.

Figure 15A:
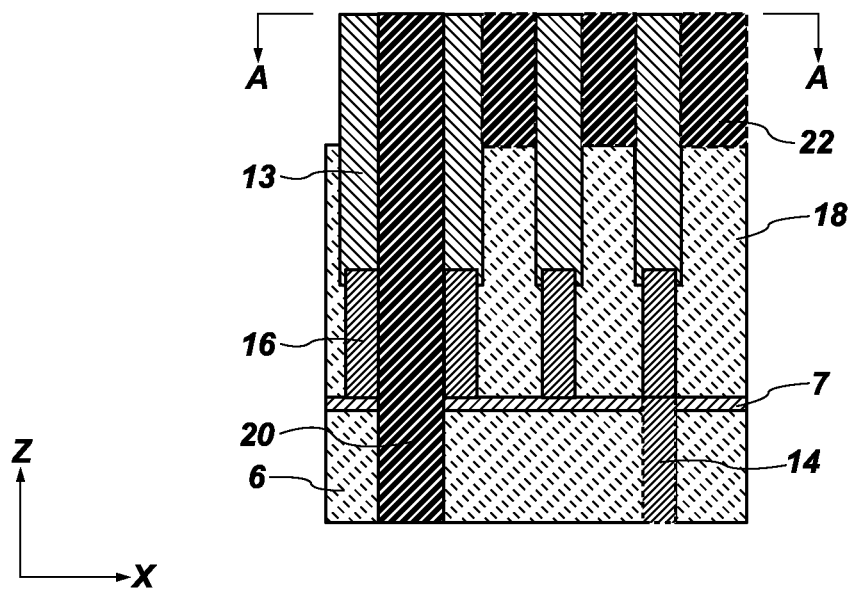
Figure 15B:
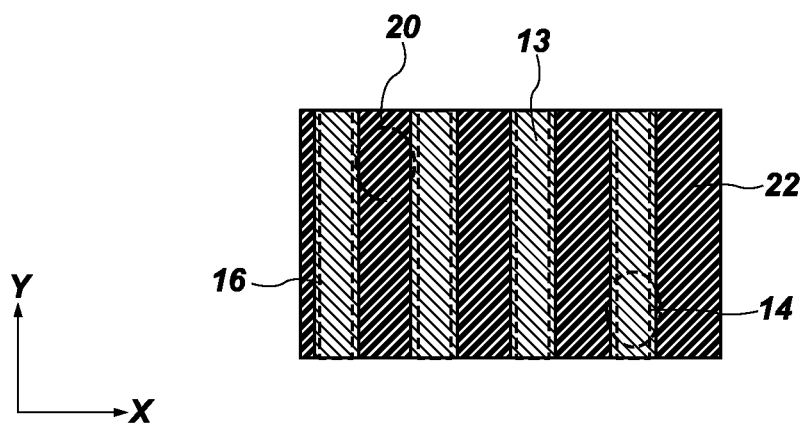
Figure 16A:
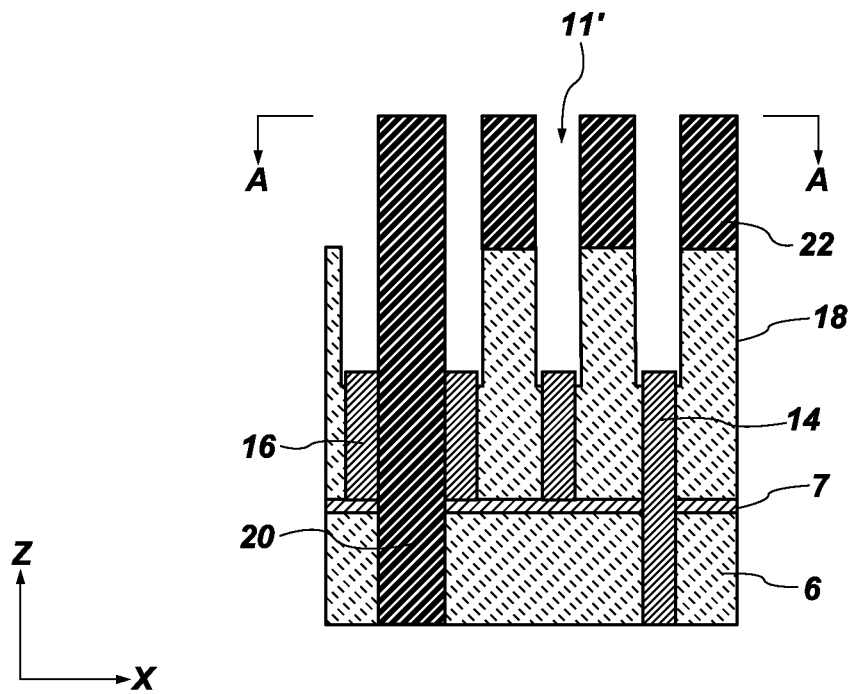
Figure 16B:
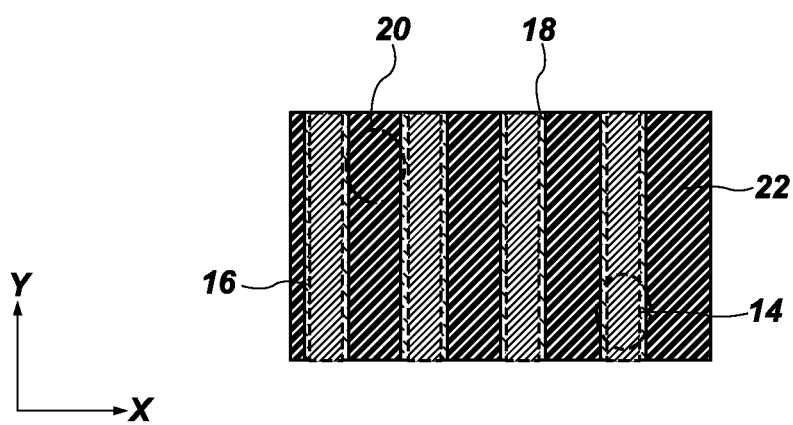

After removing the sacrificial material 17, one or more conductive materials may be formed in the openings 15A, 15B to form the L2 contacts 20 and L2 bitlines 22, as shown in FIGS. 15A and 15B. The conductive material may be one or more of the conductive materials previously discussed and may be formed by conventional techniques. In some embodiments, the conductive material of the L2 contacts 20 and the L2 bitlines 22 is tungsten and titanium nitride is used as a liner for the tungsten. However, in other embodiments, different conductive materials may be used for the L2 contacts 20 and the L2 bitlines 22. Excess conductive material may be removed from over the cap material 13, such as by CMP. The cap material 13 may then be removed, as shown in FIGS. 16A and 16B, forming the openings 11' and exposing a portion of the L1 bitlines 16. The cap material 13 may be removed by conventional techniques.

Figure 17A:
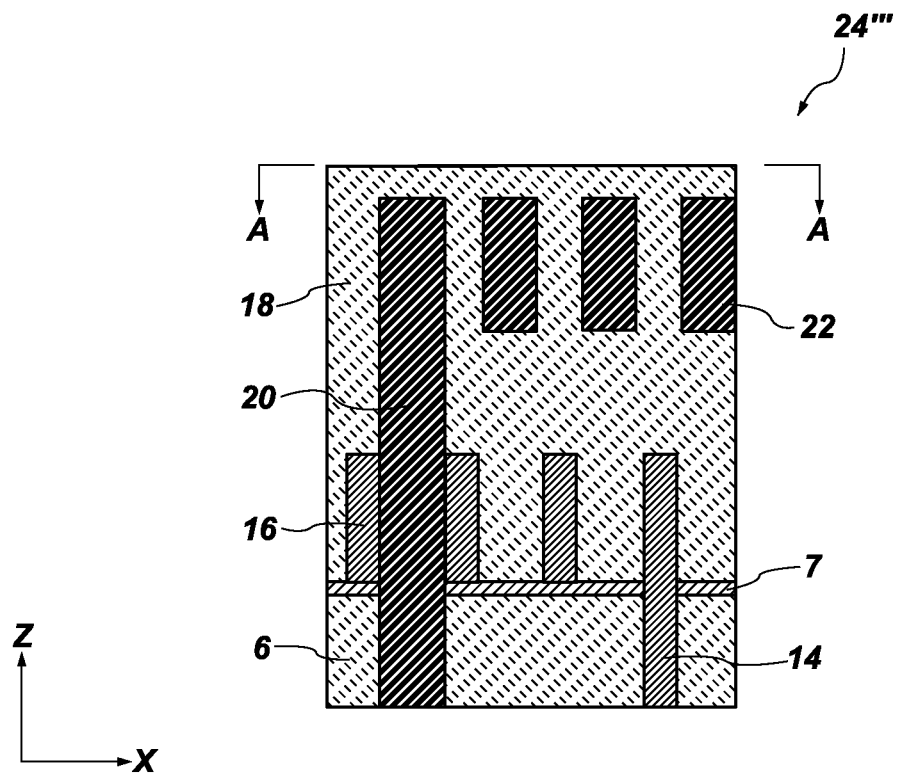
FIGS. 17A-18B are cross-sectional and top down views of electronic devices including multilevel bitlines according to additional embodiments of the disclosure.
Figure 17B:
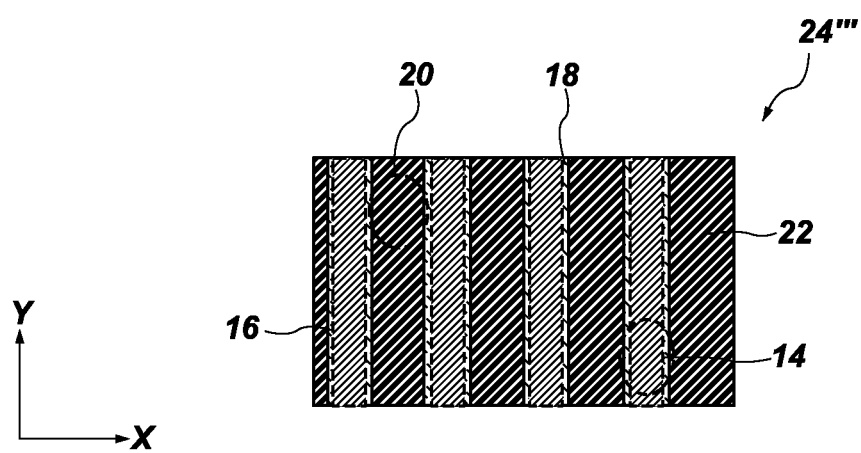

As shown in FIGS. 17A and 17B, additional third dielectric material 18 is formed in the openings 11', in place of the cap material 13, to form the electronic device 24'''. Since the openings 11' are wider than the L1 bitlines 16, the third dielectric material 18 may also be formed around a portion of the upper sidewalls of the L1 bitlines 16. The third dielectric material 18 may be formed between the L2 contacts 20 and the L2 bitlines 22 and over the L1 bitlines 16 by conventional techniques. In some embodiments, the third dielectric material 18 is silicon dioxide. Excess third dielectric material 18 may be removed, such as by CMP, forming the electronic device 24''' of FIGS. 17A and 17B. Adjacent (e.g., laterally adjacent) L2 bitlines 22 of the electronic device 24''' may, therefore, be separated from one another by the third dielectric material 18 and adjacent (e.g., laterally adjacent) L1 bitlines 16 may be separated from one another by the third dielectric material 18. In addition, adjacent (e.g., laterally adjacent) L2 contacts 20 may be separated from one another by the third dielectric material 18 and adjacent (e.g., laterally adjacent) L1 contacts 14 may be separated from one another by the third dielectric material 18 and the first dielectric material 6. The third dielectric material 18, therefore, isolates the conductive components (e.g., the L1 contacts 14, the L1 bitlines 16, the L2 contacts 20, the L2 bitlines 22) of the electronic device 24'''.

Figure 18A:
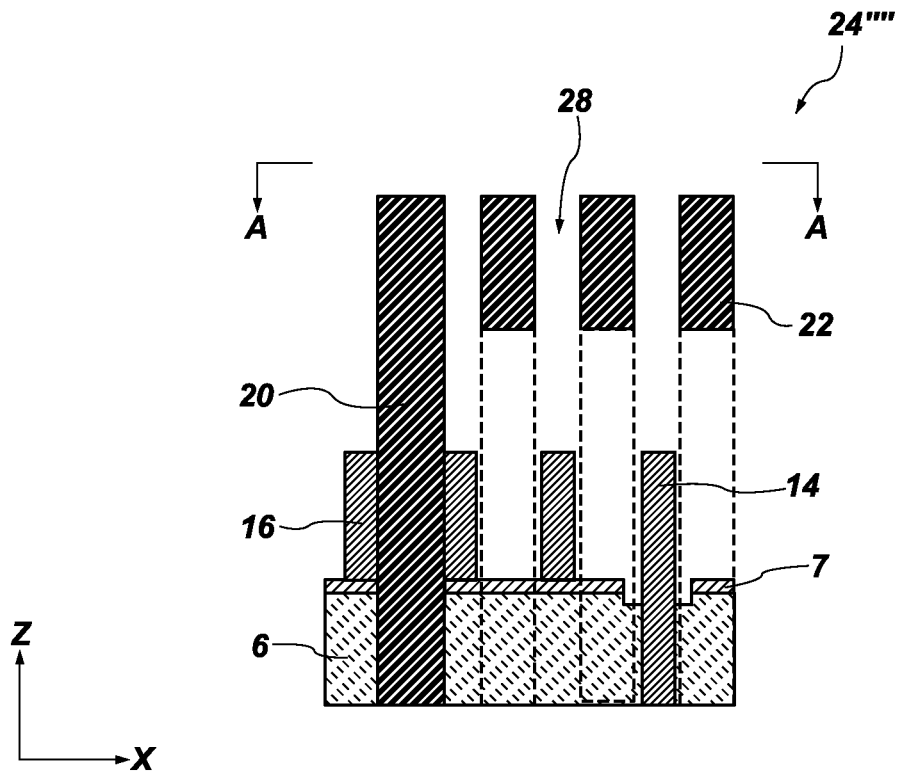
Figure 18B:
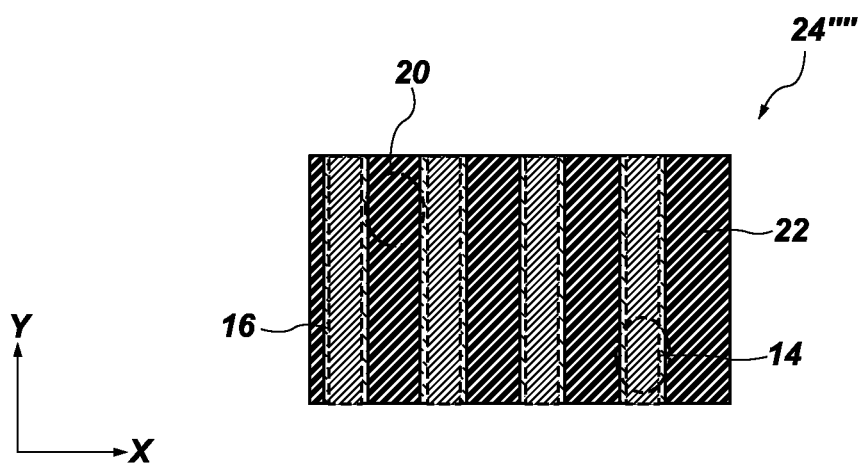

To form the electronic device 24'''' shown in FIGS. 18A and 18B, exposed portions of the third dielectric material 18 in FIGS. 16A and 16B may be removed to form the air gaps 28'. The electronic device 24'''' includes the air gaps 28', which are formed by removing portions of the third dielectric material 18. The third dielectric material 18 below the L2 bitlines 22 may be removed to form the air gaps 28' that extend from a lower surface of the L2 bitlines 22 and into the first dielectric material 6. The air gaps 28' are located between the L2 contacts 20, the L2 bitlines 22, and the L1 bitlines 16. The air gaps 28' may also extend below the L1 bitlines 16 proximal to the L2 contacts 20 in the first dielectric material 6. Adjacent (e.g., laterally adjacent) L2 bitlines 22 may, therefore, be separated from one another by the air gaps 28' and adjacent (e.g., laterally adjacent) L1 bitlines 16 may be separated from one another by the air gaps 28'. In addition, adjacent (e.g., laterally adjacent) L2 contacts 20 may be separated from one another by the air gaps 28' and adjacent (e.g., laterally adjacent) L1 contacts 14 may be separated from one another by the air gaps 28'. The air gaps 28', therefore, isolate the conductive components (e.g., the L1 contacts 14, the L1 bitlines 16, the L2 contacts 20, the L2 bitlines 22) of the electronic device 24''''.

During use and operation of the electronic devices 24, 24', 24'', 24''', 24'''' containing the L1 bitlines 16 and the L2 bitlines 22, each of the L1 bitlines 16 and the L2 bitlines 22 may be separately controlled by a respective select gate drain (SGD) 1908 (see FIG. 19) of the subblock. The ability to separately control the SGDs 1908 enables the L1 bitlines 16 and the L2 bitlines 22 to be separately controlled.

In the electronic devices 24, 24', 24'', lower resistance between adjacent L1 bitlines 16 is achieved compared to conventional electronic devices in which bitlines are located in only a single (e.g., one) level. Lower resistance is also achieved between adjacent L2 bitlines 22 compared to conventional electronic devices. The bitline-bitline capacitance of both the L1 bitlines 16 and the L2 bitlines 22 may also be lower in comparison to conventional electronic devices in which bitlines are located in only a single (e.g., one) level. The lower capacitance is able to be achieved in embodiments having the air gaps 28 while maintaining the integrity of the electronic devices 24', 24'' because the liner 26, 26' provides stability to the electronic devices 24', 24''. The capacitance between the L1 bitlines 16 and the L2 contacts 20 is also lower due to the presence of the liner 26, 26'. In addition, the L1 contacts 14 and the L2 contacts 20 may be formed by processes having improved process margins compared by methods of forming the conventional electronic devices. The increased width of the L2 bitlines 22 compared to the width in the conventional electronic devices in which bitlines are located in only a single (e.g., one) level also contributes to the lower resistance.

In the electronic devices 24''', 24'''', the capacitance between the L1 bitlines 16 and the L2 contacts 20 is reduced compared to conventional electronic devices in which bitlines are located in only a single (e.g., one) level since upper portions of the L1 bitlines 16 are surrounded by the third dielectric material 18.

The multilevel bitlines 16, 22 of the electronic devices 24, 24', 24'', 24''', 24'''' may be formed at smaller pitches than bitlines of conventional electronic devices. Therefore, the multilevel bitlines 16, 22 according to embodiments of the disclosure may achieve reduced bitline-bitline capacitance even while the first and second bitlines 16, 22 are formed at lower pitches. Additionally, the bitline-bitline capacitance may be reduced by forming the first bitlines 16 and the second bitlines 22 in a staggered configuration. The multilevel bitlines 16, 22 according to embodiments of the disclosure provide improved bitline-bitline capacitance between adjacent first and second bitlines 16, 22 since the bitlines are in the staggered configuration. The improved bitline-bitline capacitance may be achieved even as the pitch of the first and second bitlines 16, 22 is reduced. In other words, for a given pitch of the first and second bitlines 16, 22, the bitline-bitline capacitance is reduced compared to the bitline-bitline capacitance of a conventional electronic device. The staggered configuration of the bitlines also enables further scaling of the electronic device in the x- and z-directions.

Accordingly, an electronic device is disclosed and comprises multilevel bitlines comprising first bitlines and second bitlines. The first bitlines and the second bitlines are positioned at different levels. Pillar contacts are electrically connected to the first bitlines and to the second bitlines. Level 1 contacts are electrically connected to the first bitlines and level 2 contacts are electrically connected to the second bitlines. A liner is between the first bitlines and the level 2 contacts. Each bitline of the first bitlines is electrically connected to a single pillar contact in a subblock adjacent to the level 1 contacts and each bitline of the second bitlines is electrically connected to a single pillar contact adjacent to the level 2 contacts.

Accordingly, a method of forming an electronic device is disclosed and comprises forming a first level comprising first bitlines and level 1 contacts in a first dielectric material. A second dielectric material is formed adjacent to the first level. Openings are formed through the second dielectric material and into the first dielectric material and a liner is formed in the openings. A conductive material is formed in the openings to form level 2 contacts adjacent to the liner and level 2 bitlines are formed in electrical contact with the level 2 contacts.

Accordingly, a method of forming an electronic device is disclosed and comprises forming a first level comprising first bitlines and level 1 contacts in openings in a dielectric material. A cap material is formed adjacent to the first level and in the openings and adjacent to the first bitlines and level 1 contacts. A width of the cap material is greater than a width of the first bitlines. A portion of the dielectric material between adjacent first bitlines is removed to form openings between adjacent portions of the cap material. A sacrificial material is formed in the openings between the adjacent portions of the cap material. An additional portion of the dielectric material is removed to form additional openings in the dielectric material. One or more conductive materials is formed in the openings and in the additional openings to form second bitlines and level 2 contacts in electrical contact with one another.

The multilevel bitlines 16, 22 in the electronic devices 24, 24', 24", 24"', 24"" (shown in FIG. 19 as 1901) according to embodiments of the disclosure correspond to multilevel bitlines 1902 and are electrically connected to access lines (e.g., wordlines 1905), as shown in apparatus 1900 of FIG. 19. The apparatus 1900 includes the multilevel bitlines 1902 (e.g., first bitlines 16 and second bitlines 22) of the electronic devices 24, 24', 24", 24"', 24"". The apparatus 1900 includes blocks (e.g., memory blocks), with each block including multiple subblocks that contain the multilevel bitlines 1902. In some embodiments, each block includes four subblocks. In other embodiments, each block includes six subblocks. The apparatus 1900 may include a staircase structure 1920 defining contact regions for connecting the wordlines 1905 to conductive materials of tiers, which are positioned below the pillar contacts. The apparatus 1900 may include vertical strings 1907 of memory cells 1903 that are coupled to each other in series. The vertical strings 1907 may extend vertically (e.g., in the Z-direction) and orthogonally to the multilevel bitlines 1902. The apparatus 1900 also includes first select gate drain 1908 (e.g., upper select gates, first select gates, select gate drains (SGDs)), select lines 1909, and a second select gate 1910 (e.g., a lower select gate, a source select gate (SGS).

The apparatus 1900 may also include a control unit 1912 positioned under the staircase structure 1920. The control unit 1912 may include at least one of string driver circuitry, pass gates, circuitry for selecting gates, circuitry for selecting the multilevel bitlines 1902 and the wordlines 1905, circuitry for amplifying signals, and circuitry for sensing signals. The control unit 1912 may be electrically coupled to the multilevel bitlines 1902 including the L1 bitlines 16 and the L2 bitlines 22, the wordlines 1905, a source tier 1904, the first select gate drain 1908, and the second select gates 1910, for example. In some embodiments, the control unit 1912 includes CMOS (complementary metal-oxide-semiconductor) circuitry. In such embodiments, the control unit 1912 may be characterized as having a "CMOS under Array" ("CuA") configuration. The electronic devices 24, 24', 24", 24"', 24"" or apparatus 1900 according to embodiments of the disclosure may include, but is not limited to, a 3D electronic device, such as a 3D NAND Flash memory device, (e.g., a multideck 3D NAND Flash memory device).

During use and operation, the apparatus 1900 containing the first bitlines 16 and the second bitlines 22 (e.g., the multilevel bitlines 16, 22) may be independently controlled by a respective SGD 1908 of the subblock. The SGDs 1908 are formed adjacent to (e.g., under) the first bitlines 16 and the second bitlines 22, as known in the art. Within a particular block, the wordlines 1905 are connected together and the SGDs 1908 have different biases and may be separately controlled. Therefore, the first bitlines 16 and the second bitlines 22 may read out the state of a selected memory cell between "ON" and "OFF," and control the potential of the vertical strings using the SGDs 1908.

Figure 20:
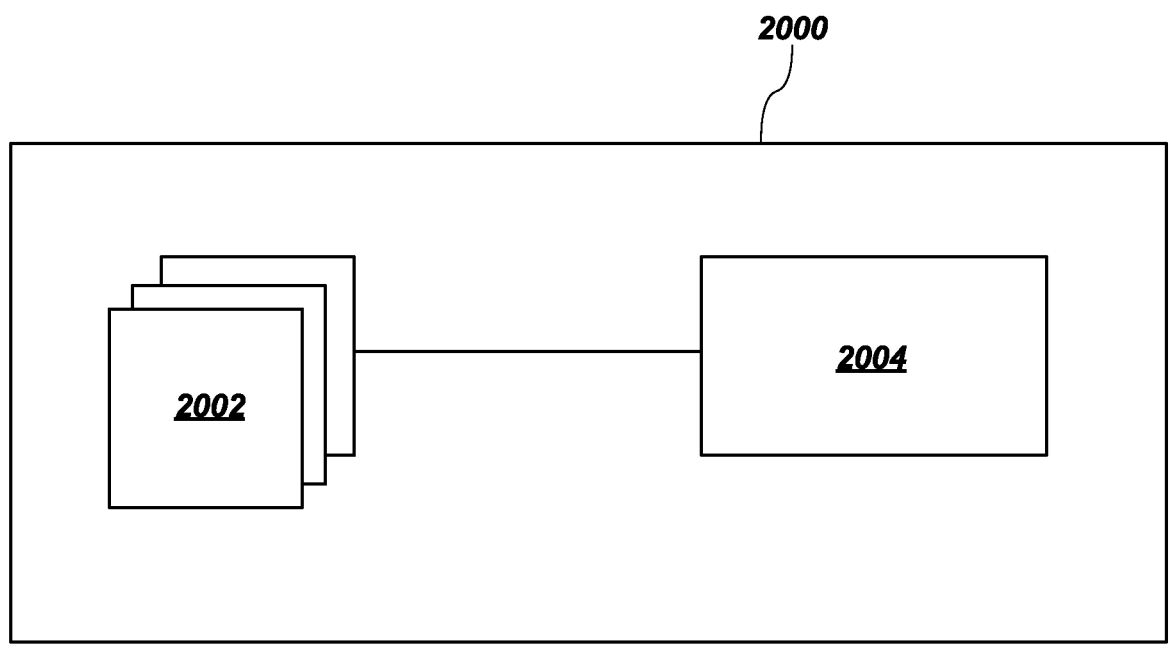
FIG. 20 is a functional block diagram of an electronic device including the multilevel bitlines according to embodiments of the disclosure.

One or more of the electronic devices 24, 24', 24", 24"', 24"" or apparatus 1900 may be present in a memory array 2000, as shown schematically in FIG. 20. The memory array 2000 includes a memory array of memory cells 2002 and a control logic component 2004. The electronic devices 24, 24', 24", 24"', 24"" or the apparatus 1900 according to embodiments of the disclosure include multiple memory cells. The control logic component 2004 may be configured to operatively interact with the memory array of memory cells 2002 so as to read, write, or re-fresh any or all memory cells within the memory array of memory cells 2002. The memory cells of the memory array 2000 are coupled to access lines (e.g., the wordlines 1905), and the access lines are coupled to control gates of the memory cells. A string of memory cells of the memory array 2000 is coupled in series between a source line and the multilevel bitlines 1902. The memory cells are positioned between the wordlines 1905 and the multilevel bitlines 1902. The wordlines 1905 may be in electrical contact with, for example, conductive materials of the tiers, and the multilevel bitlines 1902 may be in electrical contact with an electrode (e.g., a top electrode) of the tiers. The multilevel bitlines 1902 may directly overlie a row or column of the memory cells and contact the top electrode thereof. Each of the wordlines 1905 may extend in a first direction and may connect a row of the memory cells. Each of the multilevel bitlines 1902 may extend in a second direction that is at least substantially perpendicular to the first direction and may connect a column of the memory cells. A voltage applied to the wordlines 1905 and the multilevel bitlines 1902 may be controlled such that an electric field may be selectively applied at an intersection of at least one wordline 1905 and at least one multilevel bitline 1902, enabling the memory cells to be selectively operated. Additional process acts to form the memory array 2000 including the one or more electronic devices 24, 24', 24", 24''', 24'''' or apparatus 1900 are conducted by conventional techniques.

Figure 21:
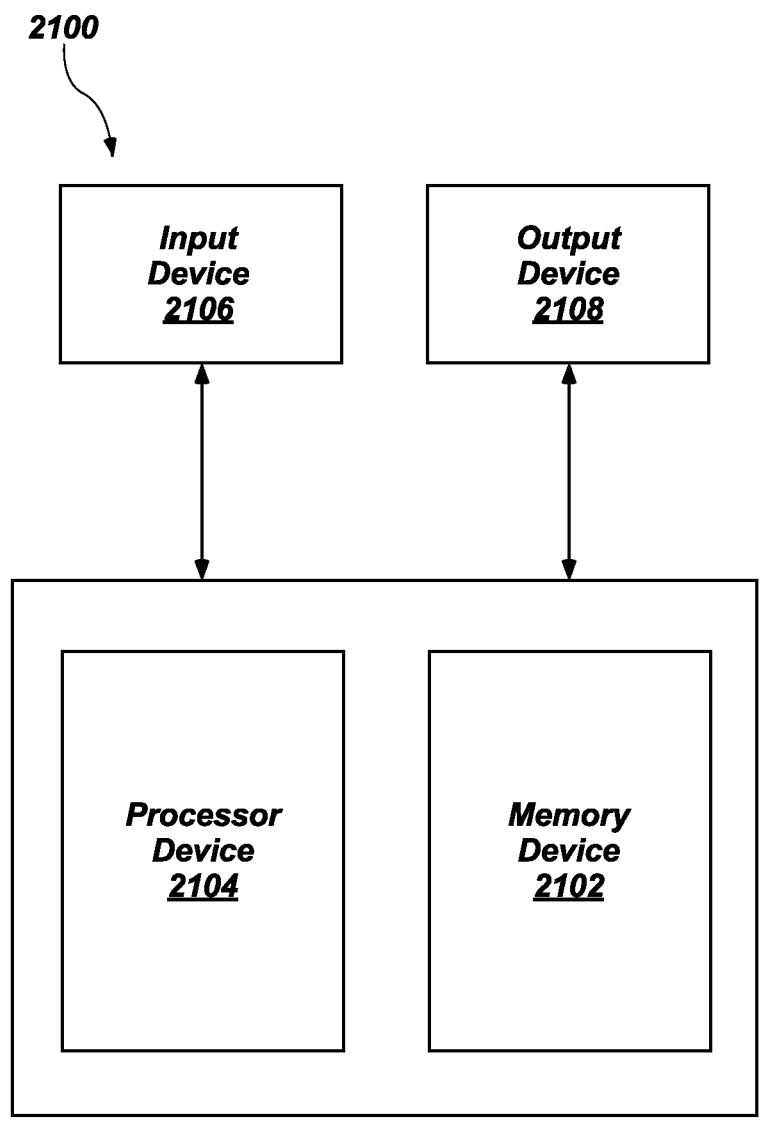
FIG. 21 is a simplified block diagram of a system including one or more electronic devices according to embodiments of the disclosure.

An electronic system 2100 is also disclosed, as shown in FIG. 21, and includes the one or more electronic devices 24, 24', 24", 24''', 24'''' or apparatus 1900 according to embodiments of the disclosure. FIG. 21 is a simplified block diagram of the electronic system 2100 implemented according to one or more embodiments described herein. The electronic system 2100 may comprise, for example, a computer or computer hardware component, a server or other networking hardware component, a cellular telephone, a digital camera, a personal digital assistant (PDA), portable media (e.g., music) player, a Wi-Fi or cellular-enabled tablet such as, for example, an iPad® or SURFACE® tablet, an electronic book, a navigation device, etc. The electronic system 2100 includes at least one memory device 2102, which includes the electronic devices 24, 24', 24", 24''', 24'''' or apparatus 1900 as previously described. The electronic system 2100 may further include at least one processor device 2104, such as a microprocessor, to control the processing of system functions and requests in the electronic system 2100. The processor device 2104 and other subcomponents of the electronic system 2100 may include the memory cells. The processor device 2104 may, optionally, include one or more memory arrays 2100 as previously described.

Various other devices may be coupled to the processor device 2104 depending on the functions that the electronic system 2100 performs. For example, an input device 2106 may be coupled to the processor device 2104 for inputting information into the electronic system 2100 by a user, such as, for example, a mouse or other pointing device, a button, a switch, a keyboard, a touchpad, a light pen, a digitizer and stylus, a touch screen, a voice recognition system, a microphone, a control panel, or a combination thereof. An output device 2108 for outputting information (e.g., visual or audio output) to a user may also be coupled to the processor device 2104. The output device 2108 may include an LCD display, an SED display, a CRT display, a DLP display, a plasma display, an OLED display, an LED display, a three-dimensional projection, an audio display, or a combination thereof. The output device 2108 may also include a printer, an audio output jack, a speaker, etc. In some embodiments, the input device 2106 and the output device 2108 may comprise a single touchscreen device that can be used both to input information to the electronic system 2100 and to output visual information to a user. The one or more input devices 2106 and output devices 2108 may communicate electrically with at least one of the memory device 2102 and the processor device 2104. The at least one memory device 2102 and processor device 2104 may also be used in a system on chip (SoC).

Accordingly, a system is disclosed. The system comprises a processor operably coupled to an input device and an output device, and one or more electronic devices operably coupled to the processor. The one or more electronic devices comprise multilevel bitlines comprising first bitlines and second bitlines. The first bitlines and second bitlines are positioned at different levels and the first bitlines and the second bitlines are electrically connected to memory cells. Level 1 contacts are electrically connected to the first bitlines and level 2 contacts are electrically connected to the second bitlines. The level 2 contacts are separated from laterally adjacent first bitlines by a liner. Pillar contacts are electrically connected to the first bitlines and to the second bitlines.

While certain illustrative embodiments have been described in connection with the figures, those of ordinary skill in the art will recognize and appreciate that embodiments encompassed by the disclosure are not limited to those embodiments explicitly shown and described herein. Rather, many additions, deletions, and modifications to the embodiments described herein may be made without departing from the scope of embodiments encompassed by the disclosure, such as those hereinafter claimed, including legal equivalents. In addition, features from one disclosed embodiment may be combined with features of another disclosed embodiment while still being encompassed within the scope of the disclosure.

What is claimed is:

1. An electronic device comprising:
    multilevel bitlines comprising first bitlines and second bitlines, the first bitlines and the second bitlines positioned at different levels;
    level 1 contacts electrically connected to the first bitlines; and
    level 2 contacts electrically connected to the second bitlines;
    a liner between the first bitlines and the level 2 contacts; and
    each bitline of the first bitlines electrically connected to a single pillar contact in a subblock adjacent to the level 1 contacts and each bitline of the second bitlines electrically connected to a single pillar contact adjacent to the level 2 contacts.

2. The electronic device of claim 1, wherein the bitlines of the first bitlines are equally spaced from one another.

3. The electronic device of claim 1, wherein the bitlines of the second bitlines are equally spaced from one another.

4. The electronic device of claim 1, wherein the second bitlines exhibit a greater width than a width of the level 2 contacts.

5. The electronic device of claim 1, wherein the liner is coextensive with a height of the level 2 contacts.

6. The electronic device of claim 1, wherein the liner is laterally adjacent to the first bitlines and the level 2 contacts.

7. The electronic device of claim 1, wherein the liner is between the first bitlines and the level 2 contacts only proximal to the first bitlines.

8. The electronic device of claim 7, wherein a height of the liner is less than a height of the first bitlines.

9. The electronic device of claim 1, wherein adjacent second bitlines are separated by a dielectric material.

10. The electronic device of claim 1, wherein adjacent second bitlines are separated by air gaps.

11. The electronic device of claim 10, wherein adjacent level 2 contacts are separated by the air gaps.

12. The electronic device of claim 1, wherein a spacing between adjacent first bitlines is relatively smaller than a diameter of the level 2 contacts.

13. The electronic device of claim 1, wherein the first bitlines and the second bitlines at least partially overlap in a vertical direction.

14. A system, comprising:
a processor operably coupled to an input device and an output device; and
one or more electronic devices operably coupled to the processor, the one or more electronic devices comprising:
multilevel bitlines comprising first bitlines and second bitlines, the first bitlines and the second bitlines positioned at different levels and the first bitlines and the second bitlines electrically connected to memory cells, the first bitlines and the second bitlines being electrically connected to pillar contacts;
level 1 contacts electrically connected to the first bitlines; and
level 2 contacts electrically connected to the second bitlines and separated from laterally adjacent first bitlines by a liner.

15. The system of claim 14, wherein the liner is coextensive with the level 2 contacts.

16. The system of claim 14, wherein a height of the liner is less than a height of the first bitlines.

17. The system of claim 14, wherein a height of the liner is greater than a height of the first bitlines and less than a height of the level 2 contacts.

18. The system of claim 14, wherein air gaps separate laterally adjacent second bitlines from one another.

19. The system of claim 14, wherein a horizontal spacing between the first bitlines is relatively narrower than a diameter of the level 2 contacts between the first bitlines.

20. A method of forming an electronic device, comprising:
forming a first level comprising first bitlines and level 1 contacts in a first dielectric material, the level 1 contacts electrically connected to the first bitlines;
forming a second dielectric material adjacent to the first level;
forming openings through the second dielectric material and into the first dielectric material;
forming a liner in the openings;
forming a conductive material in the openings to form level 2 contacts adjacent to the liner, the liner between the first bitlines and the level 2 contacts; and
forming second bitlines in electrical contact with the level 2 contacts, the first bitlines and the second bitlines positioned at different levels and each bitline of the first bitlines electrically connected to a single pillar contact in a subblock adjacent to the level 1 contacts and each bitline of the second bitlines electrically connected to a single pillar contact adjacent to the level 2 contact.

21. The method of claim 20, wherein forming openings through the second dielectric material and into the first dielectric material comprises removing a portion of the first bitlines.

22. The method of claim 20, wherein forming second bitlines in electrical contact with the level 2 contacts comprises forming the second bitlines exhibiting a greater width than a diameter of the level 2 contacts.

23. The method of claim 20, wherein forming a conductive material in the openings to form level 2 contacts adjacent to the liner comprises forming the level 2 contacts coextensive with the liner.

24. The method of claim 20, further comprising removing the second dielectric material to form air gaps adjacent to the second bitlines.

25. The method of claim 24, wherein removing the second dielectric material comprises extending the air gaps from an upper surface of the second bitlines to below the first bitlines.

26. The method of claim 25, wherein removing the second dielectric material comprises forming the air gaps laterally adjacent to the second bitlines and to the liner.

27. The method of claim 24, further comprising removing a portion of the liner adjacent to the level 2 contacts.

28. The method of claim 27, wherein removing a portion of the liner comprises extending the air gaps to be laterally adjacent to the first bitlines.

* * * * *

UNITED STATES PATENT AND TRADEMARK OFFICE
CERTIFICATE OF CORRECTION

PATENT NO. : 12,237,259 B2
APPLICATION NO. : 17/443531
DATED : February 25, 2025
INVENTOR(S) : Yoshiaki Fukuzumi et al.

Page 1 of 1

It is certified that error appears in the above-identified patent and that said Letters Patent is hereby corrected as shown below:

In the Specification

Column 18,   Line 15,   change "select gate (SGS)." to --select gate (SGS)).--

Signed and Sealed this
Twenty-ninth Day of April, 2025

Coke Morgan Stewart
*Acting Director of the United States Patent and Trademark Office*